(12) United States Patent
Kajiyama

(10) Patent No.: US 7,916,521 B2
(45) Date of Patent: Mar. 29, 2011

(54) MAGNETIC RANDOM ACCESS MEMORY AND WRITE METHOD OF THE SAME

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 467 days.

(21) Appl. No.: 11/960,067

(22) Filed: Dec. 19, 2007

(65) Prior Publication Data
US 2008/0165454 A1 Jul. 10, 2008

(30) Foreign Application Priority Data

Dec. 20, 2006 (JP) ................................. 2006-343166

(51) Int. Cl.
*G11C 11/00* (2006.01)
(52) U.S. Cl. ......... 365/158; 365/148; 365/171; 977/935
(58) Field of Classification Search .................... 365/48, 365/55, 62, 66, 74, 78, 80–93, 100, 130, 365/131, 148, 158, 171–173, 225.5, 243.5; 216/22; 257/421, E21.665; 438/3; 977/933–935
See application file for complete search history.

(56) References Cited

U.S. PATENT DOCUMENTS

| 6,844,204 B2 | 1/2005 | Asao |
| 7,190,613 B2 | 3/2007 | Nagase et al. |
| 2004/0021189 A1* | 2/2004 | Yoda et al. ...................... 257/421 |
| 2004/0100818 A1* | 5/2004 | Yoda et al. ...................... 365/173 |
| 2006/0067008 A1* | 3/2006 | Haratani ........................ 360/321 |
| 2006/0176734 A1 | 8/2006 | Braun |

FOREIGN PATENT DOCUMENTS

| JP | 2004-128011 | 4/2004 |
| JP | 2004-128430 | 4/2004 |
| JP | 2004-153181 | 5/2004 |
| JP | 2005-203535 | 7/2005 |

* cited by examiner

*Primary Examiner* — Richard Elms
*Assistant Examiner* — Harry W Byrne
(74) *Attorney, Agent, or Firm* — Oblon, Spivak, McClelland, Maier & Neustadt, L.L.P.

(57) ABSTRACT

A magnetic random access memory includes a magnetoresistive effect element which includes a fixed layer in which a magnetization direction is fixed, a recording layer in which a magnetization direction is reversible, and a nonmagnetic layer formed between the fixed layer and the recording layer, and in which the magnetization directions in the fixed layer and the recording layer take one of a parallel state and an antiparallel state in accordance with a direction of an electric current supplied between the fixed layer and the recording layer, and a yoke layer which concentrates a magnetic field generated by the electric current, and causes the magnetic field to act on magnetization in the recording layer.

15 Claims, 21 Drawing Sheets

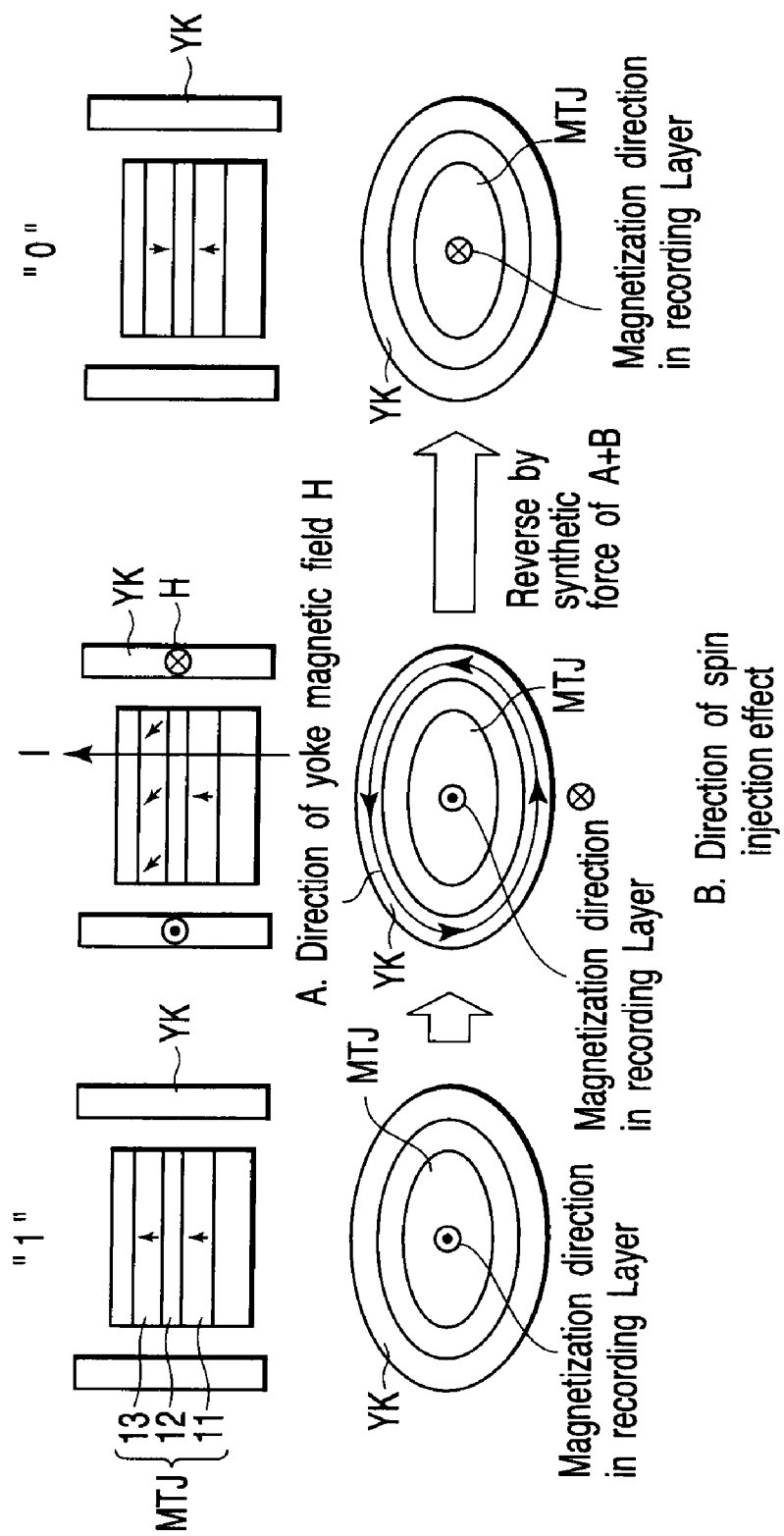

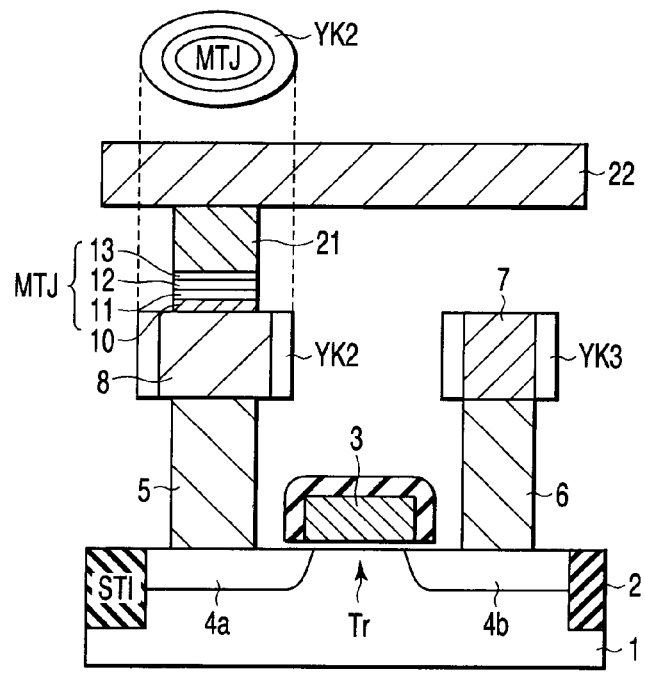
F I G. 11
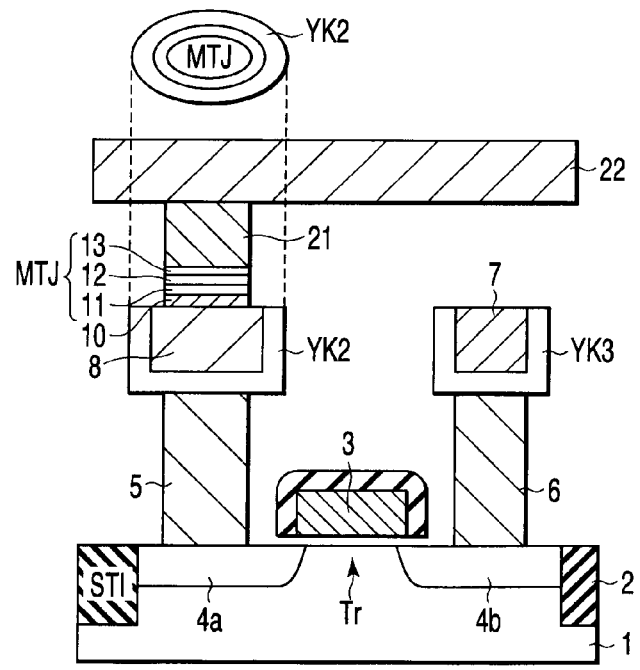
F I G. 12

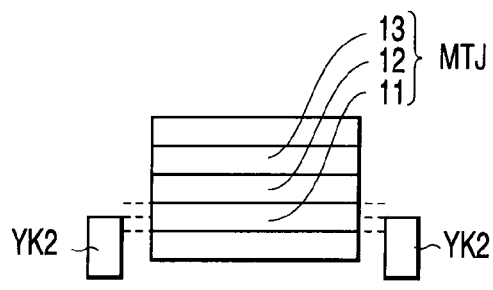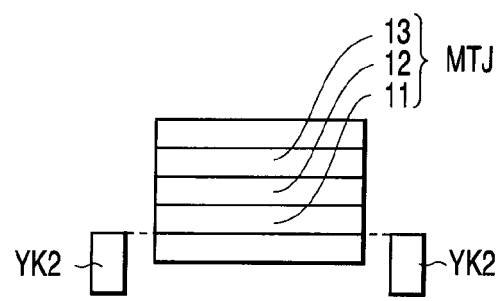
FIG. 13A　　　　　FIG. 13B
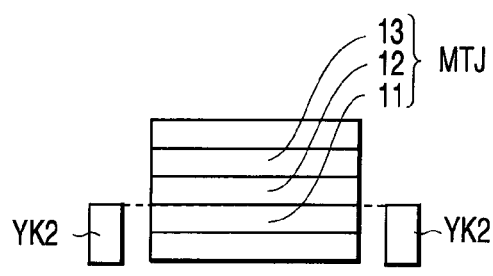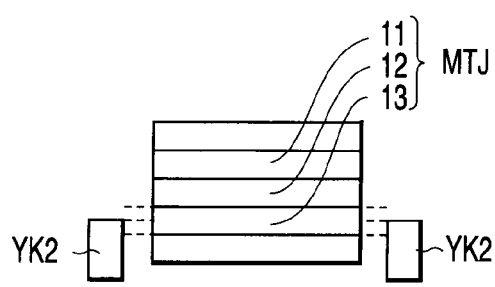
FIG. 13C　　　　　FIG. 13D
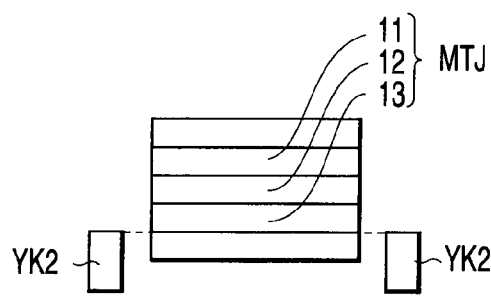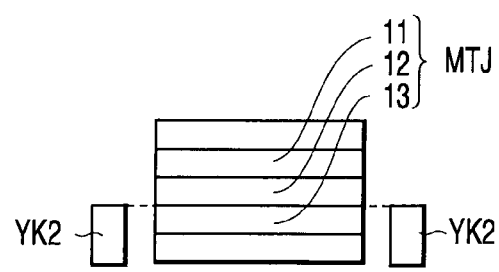
FIG. 13E　　　　　FIG. 13F

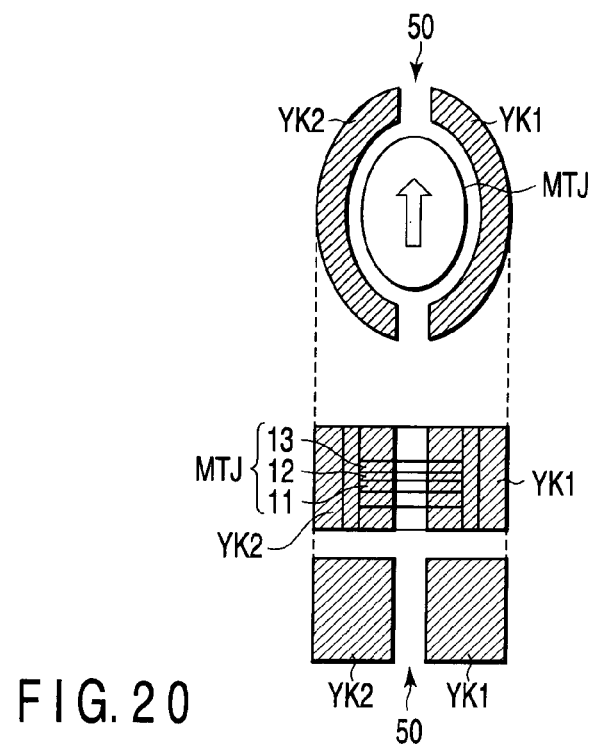
F I G. 20
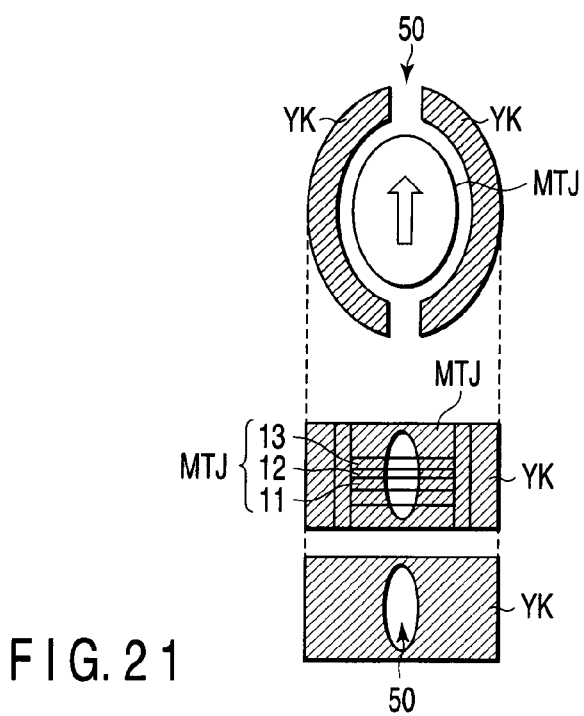
F I G. 21

Direction of yoke magnetic field H

Magnetization direction in recording Layer

—— Gate
------ Sourse line
—·— Bit line
✗ Source line contact
✕ Bit line contact

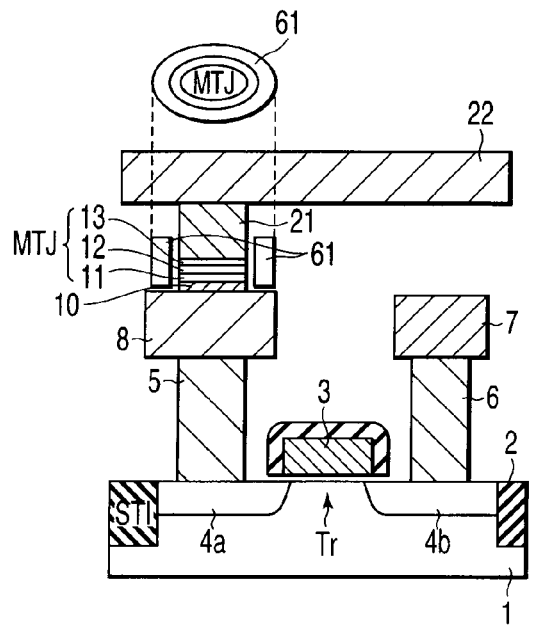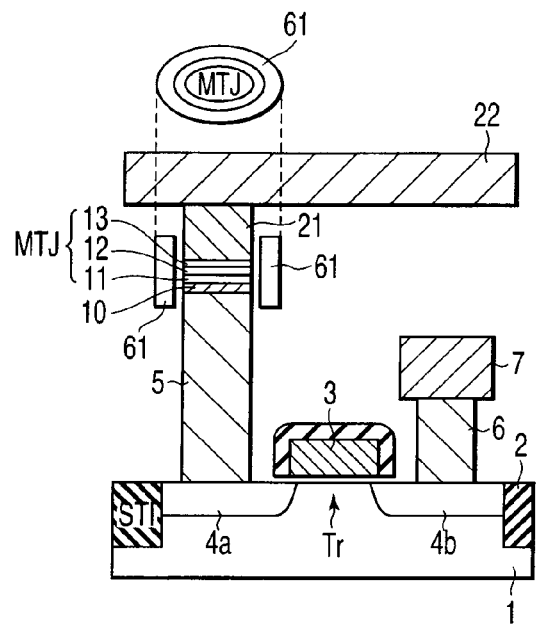
FIG. 28A    FIG. 28B
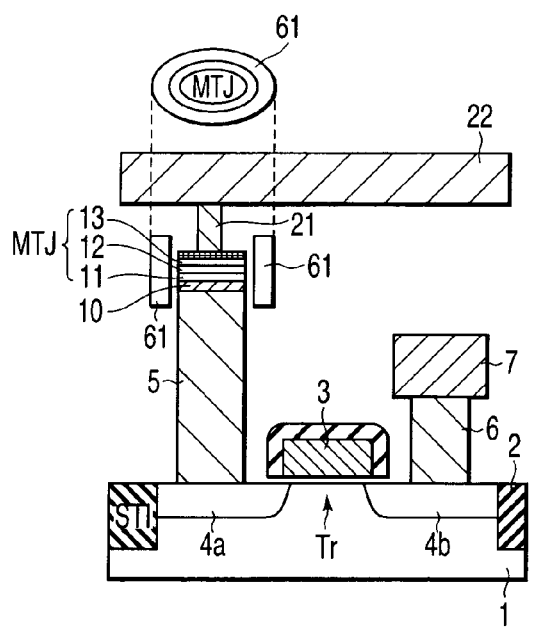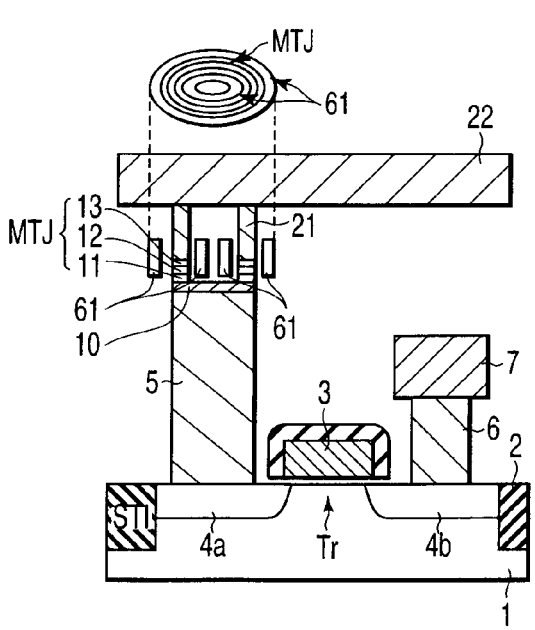
FIG. 28C    FIG. 28D

MAGNETIC RANDOM ACCESS MEMORY AND WRITE METHOD OF THE SAME

CROSS-REFERENCE TO RELATED APPLICATIONS

This application is based upon and claims the benefit of priority from prior Japanese Patent Application No. 2006-343166, filed Dec. 20, 2006, the entire contents of which are incorporated herein by reference.

BACKGROUND OF THE INVENTION

1. Field of the Invention

The present invention relates to a magnetic random access memory and a write method of the same.

2. Description of the Related Art

Recently, a spin injection magnetization type magnetic random access memory (MRAM) may be advantageous from the viewpoint of micropatterning and the prevention of a write error to an adjacent cell.

The current density, however, of a write current necessary for magnetization reversal is as high as $1E7 A/cm^2$. Accordingly, the amount of electric current to be supplied to a write line is larger than a practical amount, so the write current must be reduced.

Note that pieces of prior art reference information relevant to the present invention are as follows.

[Patent Reference 1] Jpn. Pat. Appln. KOKAI Publication No. 2004-128011

[Patent Reference 2] Jpn. Pat. Appln. KOKAI Publication No. 2004-153181

[Patent Reference 1] Jpn. Pat. Appln. KOKAI Publication No. 2004-128430

[Patent Reference 1] Jpn. Pat. Appln. KOKAI Publication No. 2005-203535

BRIEF SUMMARY OF THE INVENTION

A magnetic random access memory according to the first aspect of the present invention comprising a magnetoresistive effect element which includes a fixed layer in which a magnetization direction is fixed, a recording layer in which a magnetization direction is reversible, and a nonmagnetic layer formed between the fixed layer and the recording layer, and in which the magnetization directions in the fixed layer and the recording layer take one of a parallel state and an antiparallel state in accordance with a direction of an electric current supplied between the fixed layer and the recording layer, and a yoke layer which concentrates a magnetic field generated by the electric current, and causes the magnetic field to act on magnetization in the recording layer.

A write method of a magnetic random access memory according to the second aspect of the present invention comprising, a magnetoresistive effect element which includes a fixed layer in which a magnetization direction is fixed, a recording layer in which a magnetization direction is reversible, and a nonmagnetic layer formed between the fixed layer and the recording layer, and in which the magnetization directions in the fixed layer and the recording layer take one of a parallel state and an antiparallel state in accordance with a direction of an electric current supplied between the fixed layer and the recording layer, and a yoke layer surrounding a circumferential surface of the magnetoresistive effect element, wherein when the electric current is supplied between the fixed layer and the recording layer in a write operation, a magnetic field generated by the electric current concentrates to the yoke layer and acts on the recording layer, and spin-polarized electrons generated by the electric current also acts on the recording layer.

BRIEF DESCRIPTION OF THE SEVERAL VIEWS OF THE DRAWING

FIGS. 4A to 4C are views for explaining a write operation when using a perpendicular magnetization type MTJ element according to the first embodiment of the present invention;

FIG. 11 is a sectional view showing a magnetic random access memory according to the fourth embodiment of the present invention;

FIG. 12 is a sectional view showing a magnetic random access memory according to the fourth embodiment of the present invention;

FIGS. 13A to 13F are schematic views each showing the position of the upper surface of yoke layer of the magnetic random access memory according to the fourth embodiment of the present invention;

FIG. 20 is a schematic view showing vertical slits in a yoke layer according to the sixth embodiment of the present invention;

FIG. 21 is a schematic view showing vertical slits in a yoke layer according to the sixth embodiment of the present invention;

FIGS. 27A to 27D and 28A to 28D are sectional views showing magnetic random access memories according to the ninth embodiment of the present invention.

DETAILED DESCRIPTION OF THE INVENTION

Figure 1:
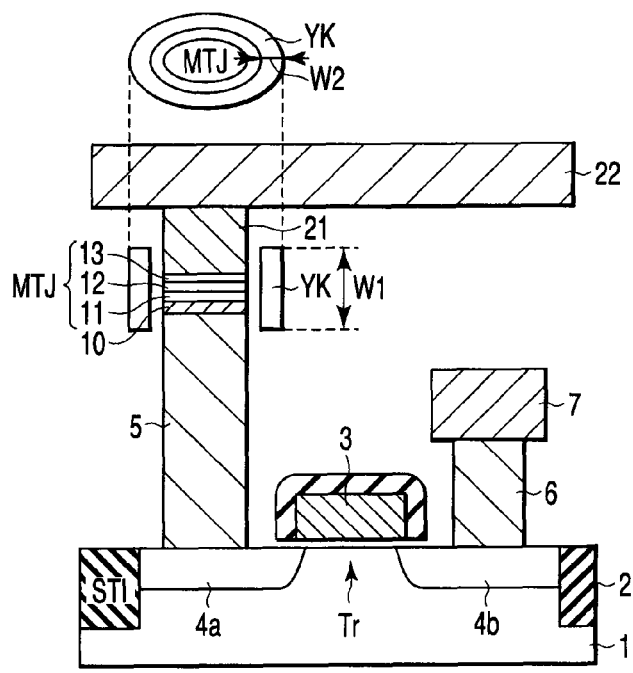
FIG. 1 is a sectional view showing a magnetic random access memory according to the first embodiment of the present invention.

Embodiments of the present invention will be explained below with reference to the accompanying drawing. In this explanation, the same reference numerals denote the same parts throughout the drawing.

In each of the first to sixth embodiments to be explained below, a magnetic random access memory (MRAM) having a yoke layer will be explained. In the seventh embodiment, cell layout examples of the magnetic random access memory of each embodiment will be explained. In the eighth embodiment, an MTJ (Magnetic Tunnel Junction) element as a magnetoresistive effect element used in the magnetic random access memory of each embodiment will be explained.

[1] First Embodiment

The first embodiment is an example in which a yoke layer is formed around an MTJ element, and a magnetic field generated by a write current flowing through the MTJ element is concentrated to this yoke layer and allowed to act on the magnetization in a recording layer.

[1-1] Structure

FIG. 1 is a sectional view of a magnetic random access memory according to the first embodiment of the present invention. The structure of the magnetic random access memory according to the first embodiment will be explained below.

As shown in FIG. 1, an element isolation region 2 having an STI (Shallow Trench Isolation) structure is formed in a semiconductor substrate (silicon substrate) 1. A gate electrode 3 is formed on a gate insulating film (not shown) on the semiconductor substrate 1. Source/drain diffusion layers 4a and 4b are formed in the semiconductor substrate 1 on the two sides of the gate electrode 3. In this manner, a transistor (e.g., a MOS transistor) Tr functioning as a switching element is formed.

A contact 5 is connected to the source/drain diffusion layer 4a of the transistor Tr. An MTJ element MTJ is formed on a lower electrode 10 on the contact 5. The MTJ element MTJ has a stacked structure in which a fixed layer (pinned layer) 11, nonmagnetic layer 12, and recording layer (free layer) 13 are sequentially stacked. A contact 21 is connected to the upper surface of the MTJ element MTJ, and an interconnection 22 is connected to the contact 21. The interconnection 22 is connected to, e.g., a power supply terminal or ground terminal.

A contact 6 is connected to the source/drain diffusion layer 4b of the transistor Tr, and an interconnection 7 is formed on the contact 6. The interconnection 7 is connected to, e.g., a power supply terminal or ground terminal.

A cylindrical yoke layer YK is formed near the MTJ element MTJ so as to surround the circumferential surfaces of the fixed layer 11, nonmagnetic layer 12, and recording layer 13. An example of the material of the yoke layer YK is a magnetic material. Practical examples are NiFe, CoFe, CoFeNi, CoFeB, IrMn, and PtMn.

The yoke layer YK may also be spaced apart from the MTJ element MTJ. When a space exists between the yoke layer YK and MTJ element MTJ, a magnetic field passes through this space if the yoke layer YK is made of a high-k material. This allows the magnetic field to have an effect in the lateral direction.

A longitudinal width W1 of the yoke layer YK may be larger than the film thickness of the MTJ element MTJ. That is, the upper surface of the yoke layer YK is higher than that of the MTJ element MTJ, and the bottom surface of the yoke layer YK is lower than that of the MTJ element MTJ. A lateral width W2 of the yoke layer YK is desirably larger than, e.g., 2 nm.

[1-2] Principle

Figure 2:
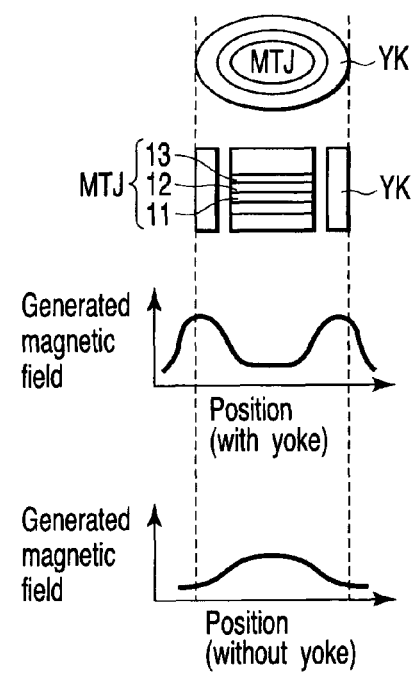
FIG. 2 is a view for explaining the principle of the magnetic field assist by a yoke layer according to the first embodiment of the present invention.

FIG. 2 is a view for explaining the principle of the magnetic field assist by the yoke layer according to the first embodiment of the present invention. The principle of the magnetic field assist according to the first embodiment will be explained below.

As shown in FIG. 2, if there is no yoke layer YK around the interconnection (MTJ element), the generated magnetic field of the interconnection peaks in the center of the interconnection and gradually weakens outward. However, when the yoke layer YK is formed around the interconnection (MTJ element) as in this embodiment, the generated magnetic field of the interconnection concentrates to the yoke layer YK. Accordingly, the generated magnetic field peaks in the yoke layer YK and gradually weakens on the two sides of the yoke layer YK. When the yoke layer YK is formed near the MTJ element MTJ as described above, the MTJ element MTJ undergoes the influence of the magnetic field concentrated to the yoke layer YK.

[1-3] Write Operations (Parallel Magnetization Type)

Figures 3A, 3B, 3C:
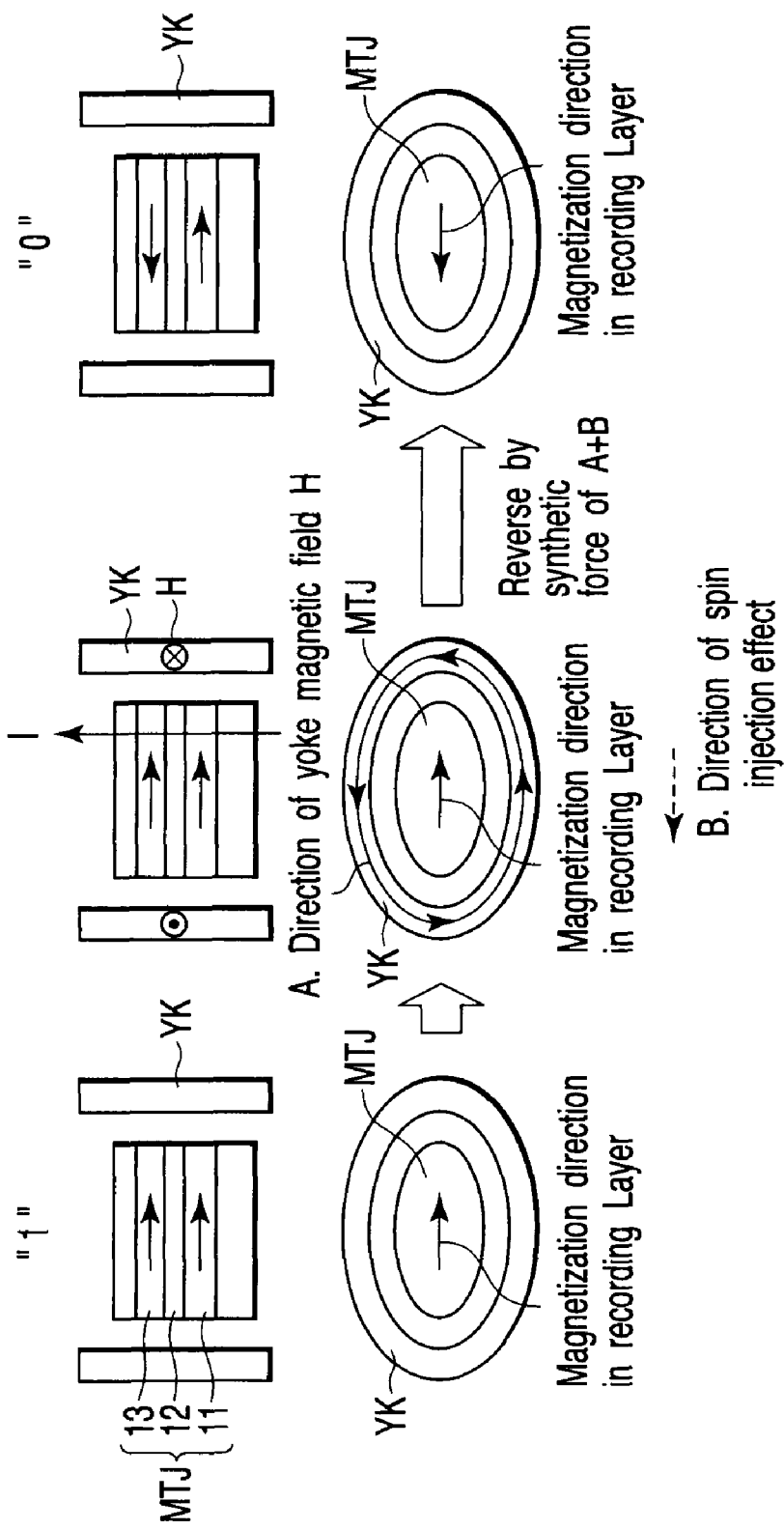
FIGS. 3A to 3C are views for explaining a write operation when using a parallel magnetization type MTJ element according to the first embodiment of the present invention.

FIGS. 3A to 3C are views for explaining a write operation when using a parallel magnetization type MTJ element according to the first embodiment of the present invention. The write operation when using the parallel magnetization type MTJ element according to the first embodiment will be explained below.

As shown in FIG. 3A, in the initial state of the MTJ element MTJ, the magnetization directions in the fixed layer 11 and recording layer 13 are parallel, and the magnetization in the recording layer 13 is rightward in the drawing surface. Assume that data "1" is recorded in this state.

When a write current I is supplied from the fixed layer 11 to the recording layer 13 of the MTJ element MTJ in this initial state as shown in FIG. 3B, two actions A and B affect the magnetization in the recording layer 13.

In the first action A, a current magnetic field H generated around the write current I concentrates to the yoke layer YK, and the magnetic field H of the yoke layer YK acts on the magnetization in the recording layer 13. The direction of the current magnetic field H is counterclockwise when the yoke layer YK is viewed from above.

In the second action B, spin-polarized electrons act on the magnetization in the recording layer 13 by the spin injection effect. The direction of the spin injection effect is leftward in the drawing surface.

Consequently, as shown in FIG. 3C, the action A obtained by the current magnetic field H of the yoke layer YK assists the precession against the magnetization reversing action B obtained by the spin injection effect. Since the synthetic force of the actions A and B reverses the magnetization in the recording layer 13, the magnetization in the recording layer 13 points leftward in the drawing surface. Accordingly, the magnetization directions in the fixed layer 11 and recording layer 13 become antiparallel, and data "0" is written.

(Perpendicular Magnetization Type)

FIGS. 4A to 4C are views for explaining a write operation when using a perpendicular magnetization type MTJ element according to the first embodiment of the present invention. The write operation when using the perpendicular magnetization type MTJ element according to the first embodiment will be explained below.

As shown in FIG. 4A, in the initial state of the MTJ element MTJ, the magnetization directions in the fixed layer 11 and recording layer 13 are parallel, and the magnetization in the recording layer 13 is upward in the drawing surface. Assume that data "1" is recorded in this state.

When a write current I is supplied from the fixed layer 11 to the recording layer 13 of the MTJ element MTJ in this initial state as shown in FIG. 4B, two actions A and B affect the magnetization in the recording layer 13.

In the first action A, a current magnetic field H generated around the write current I concentrates to the yoke layer YK, and the magnetic field H of the yoke layer YK acts on the magnetization in the recording layer 13. The direction of the current magnetic field H is counterclockwise when the yoke layer YK is viewed from above.

In the second action B, spin-polarized electrons act on the magnetization in the recording layer 13 by the spin injection effect. The direction of the spin injection effect is downward in the drawing surface.

Consequently, as shown in FIG. 4C, the action A obtained by the current magnetic field H of the yoke layer YK assists the precession against the magnetization reversing action B obtained by the spin injection effect. Since the synthetic force of the actions A and B reverses the magnetization in the recording layer 13, the magnetization in the recording layer 13 points downward in the drawing surface. Accordingly, the magnetization directions in the fixed layer 11 and recording layer 13 become antiparallel, and data "0" is written.

As described above, regardless of whether the MTJ element is the parallel magnetization type or perpendicular magnetization type, the magnetic field H concentrated to the yoke layer YK assists the precession of the spin injection magnetization reversing effect. Since this allows easy reversal of the magnetization in the recording layer 13, the reversing current reduces.

[1-4] Read Operation

The read operation of the first embodiment uses the magnetoresistive effect.

The transistor Tr connected to the MTJ element MTJ of a selected cell is turned on to supply a read current from, e.g., the interconnection 22 to the transistor Tr through the MTJ element MTJ. Whether the data is "1" or "0" is discriminated by the resistance value of the MTJ element MTJ read out on the basis of the read current.

Note that in this read operation, it is possible to read out the current value by applying a constant voltage, or read out the voltage value by supplying a constant electric current.

[1-5] Effects

In the first embodiment described above, the cylindrical yoke layer YK is formed around the MTJ element MTJ. When the write current I is supplied perpendicularly to the film surface of the MTJ element MTJ in this structure, the current magnetic field H generated by the write current I concentrates to the yoke layer YK around the MTJ element MTJ. In addition to the magnetization reversing action of spin-polarized electrons, therefore, the magnetic field H of the yoke layer YK is generated in a direction to assist the precession of the spin. Since this allows easy reversal of the magnetization in the recording layer 13, the write current can be reduced.

As a method of reducing the write current, it is also possible to form another interconnection for supplying an electric current for the magnetic field assist. If this interconnection is formed, however, the numbers of parts and fabrication steps increase, and the power consumption increases by the interconnection. By contrast, this embodiment forms no other interconnection for supplying an electric current in order to obtain the magnetic field assisting effect. In this embodiment, an electric current does not flow through the yoke layer YK itself, but flows through only the current path for spin injection. Since no other interconnection for supplying an electric current is formed, this embodiment has the advantage that no such problems as described above arise.

Also, when generating a magnetic field by a write current in the easy axis direction in the conventional structure, the efficiency is low because the interconnection-to-MTJ distance is long and the MTJ element exists in a portion where the current path bends. In addition, this structure increases the cell area because the current path bending portion must be formed. However, this embodiment enables the generated magnetic field to efficiently act by the yoke layer YK without forming any current path bending portion. Therefore, no such problems as described above arise.

[2] Second Embodiment

The second embodiment is a modification of the first embodiment, in which a slit is formed in the middle of the yoke layer of the first embodiment. Note that an explanation of the same features as in the first embodiment will not be repeated in the second embodiment.

[2-1] Structure

Figure 5:
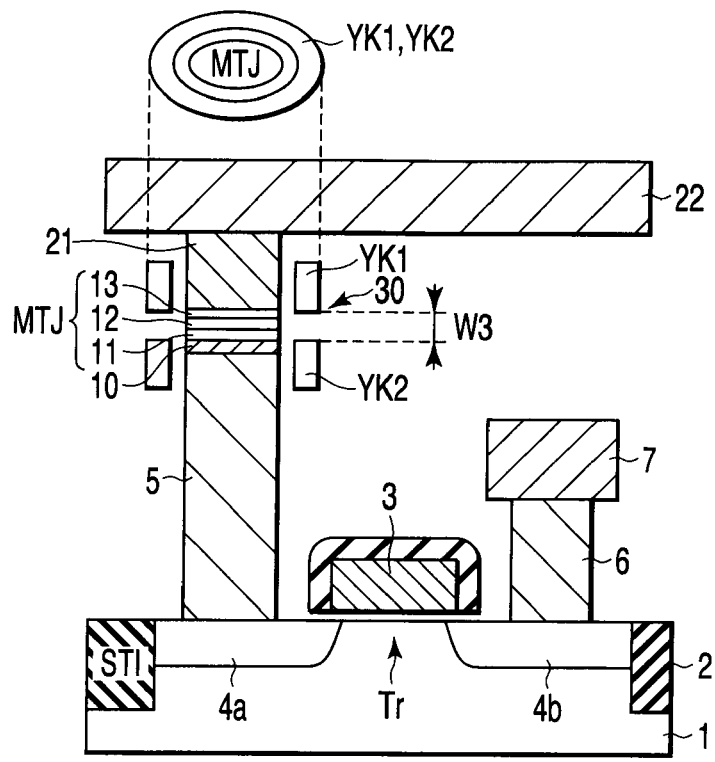
FIG. 5 is a sectional view showing a magnetic random access memory according to the second embodiment of the present invention.

FIG. 5 is a sectional view of a magnetic random access memory according to the second embodiment of the present invention. The structure of the magnetic random access memory according to the second embodiment will be explained below.

As shown in FIG. 5, the second embodiment differs from the first embodiment in that a slit 30 is formed between yoke layers YK1 and YK2.

The slit 30 is desirably positioned around a recording layer 13 of an MTJ element MTJ. That is, the yoke layers do not surround the circumferential surface of the recording layer 13. This is so in order to give the recording layer 13 the leakage magnetic field action from the end portions of the yoke layers YK1 and YK2 more efficiently. A width W3 of the slit 30 is desirably equivalent to the film thickness of the MTJ element MTJ.

[2-2] Principle

Figure 6:
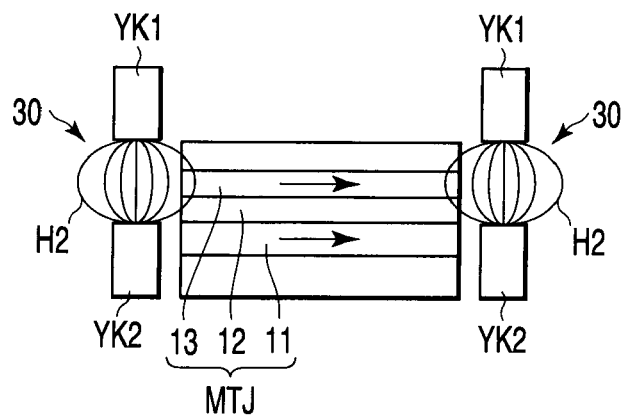
FIG. 6 is a view for explaining the principle of a magnetic field distribution from a slit in a yoke layer according to the second embodiment of the present invention.

FIG. 6 is a view for explaining the principle of the magnetic field distribution from the slit between the yoke layers according to the second embodiment of the present invention. The principle of the magnetic field distribution from the slit between the yoke layers according to the second embodiment is as follows.

As shown in FIG. 6, when the slit 30 is formed between the yoke layers YK1 and YK2, a high-density magnetic field H2 concentrated to the yoke layers YK1 and YK2 distributes like contour lines. Therefore, the effect of the action A obtained by the current magnetic field H of the yoke layer YK explained in the first embodiment can be increased by positioning the recording layer 13 of the MTJ element MTJ in this portion.

[2-3] Write Operation

Figures 7A, 7B, 7C:
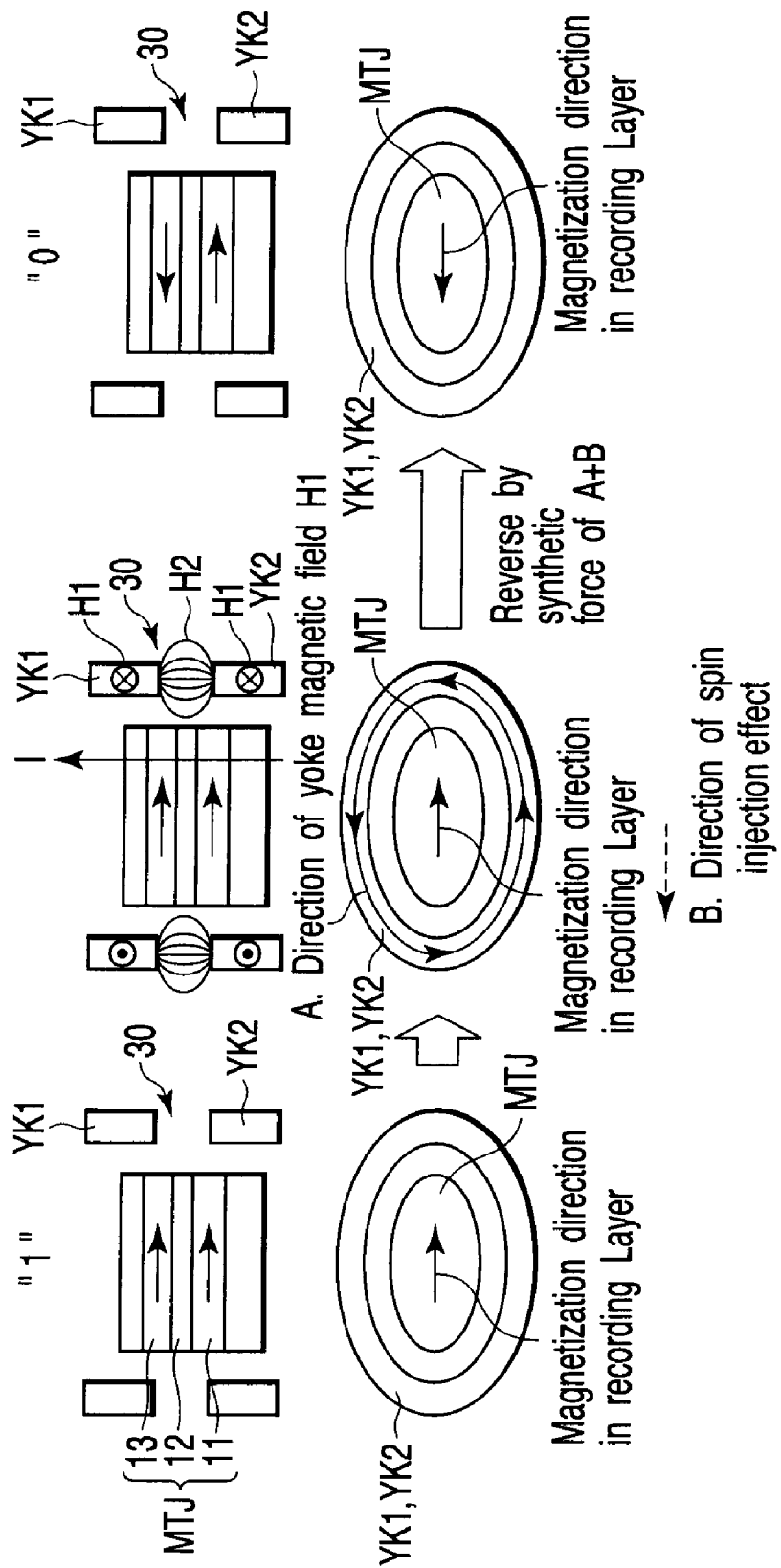
FIGS. 7A to 7C are views for explaining a write operation when using a parallel magnetization type MTJ element according to the second embodiment of the present invention.

FIGS. 7A to 7C are views for explaining a write operation when using a parallel magnetization type MTJ element according to the second embodiment of the present invention. The write operation when using the parallel magnetization type MTJ element according to the second embodiment will be explained below.

As shown in FIG. 7A, in the initial state of the MTJ element MTJ, the magnetization directions in a fixed layer 11 and the recording layer 13 are parallel, and the magnetization in the recording layer 13 is rightward in the drawing surface. Assume that data "1" is recorded in this state.

When a write current I is supplied from the fixed layer 11 to the recording layer 13 of the MTJ element MTJ in this initial state as shown in FIG. 7B, two actions A and B affect the magnetization in the recording layer 13.

In the first action A, a current magnetic field generated around the write current I concentrates to the yoke layers YK1 and YK2. As a consequence, a magnetic field H1 that is counterclockwise when the yoke layers YK1 and YK2 are viewed from above acts on the magnetization in the recording layer 13. In addition, the magnetic field H2 generated in the slit 30 between the yokes YK1 and YK2 acts on the magnetization in the recording layer 13.

In the second action B, spin-polarized electrons act on the magnetization in the recording layer 13 by the spin injection effect. The direction of the spin injection effect is leftward in the drawing surface.

Consequently, as shown in FIG. 7C, the action A obtained by the current magnetic fields H1 and H2 of the yokes YK1 and YK2 assists the precession against the magnetization reversing action B obtained by the spin injection effect. Since the synthetic force of the actions A and B reverses the magnetization in the recording layer 13, the magnetization in the recording layer 13 points leftward in the drawing surface. Accordingly, the magnetization directions in the fixed layer 11 and recording layer 13 become antiparallel, and data "0" is written.

Note that the second embodiment is applicable not only to a parallel magnetization type element but also to a perpendicular magnetization type element.

[2-4] Effects

The second embodiment described above can achieve the same effects as in the first embodiment. In addition, the slit 30 is formed between the yokes YK1 and YK2 in the second embodiment. Therefore, the high-density magnetic field H2 generated in the slit 30 allows the MTJ element MTJ to readily undergo the magnetic field assisting effect of the yokes YK1 and YK2. This makes it possible to further reduce the write current.

[3] Third Embodiment

The third embodiment is a modification of the second embodiment, which uses only the upper one of the two yoke layers in the second embodiment. Note that an explanation of the same features as in the first and second embodiments will not be repeated in the third embodiment.

[3-1] Structure

Figure 8:
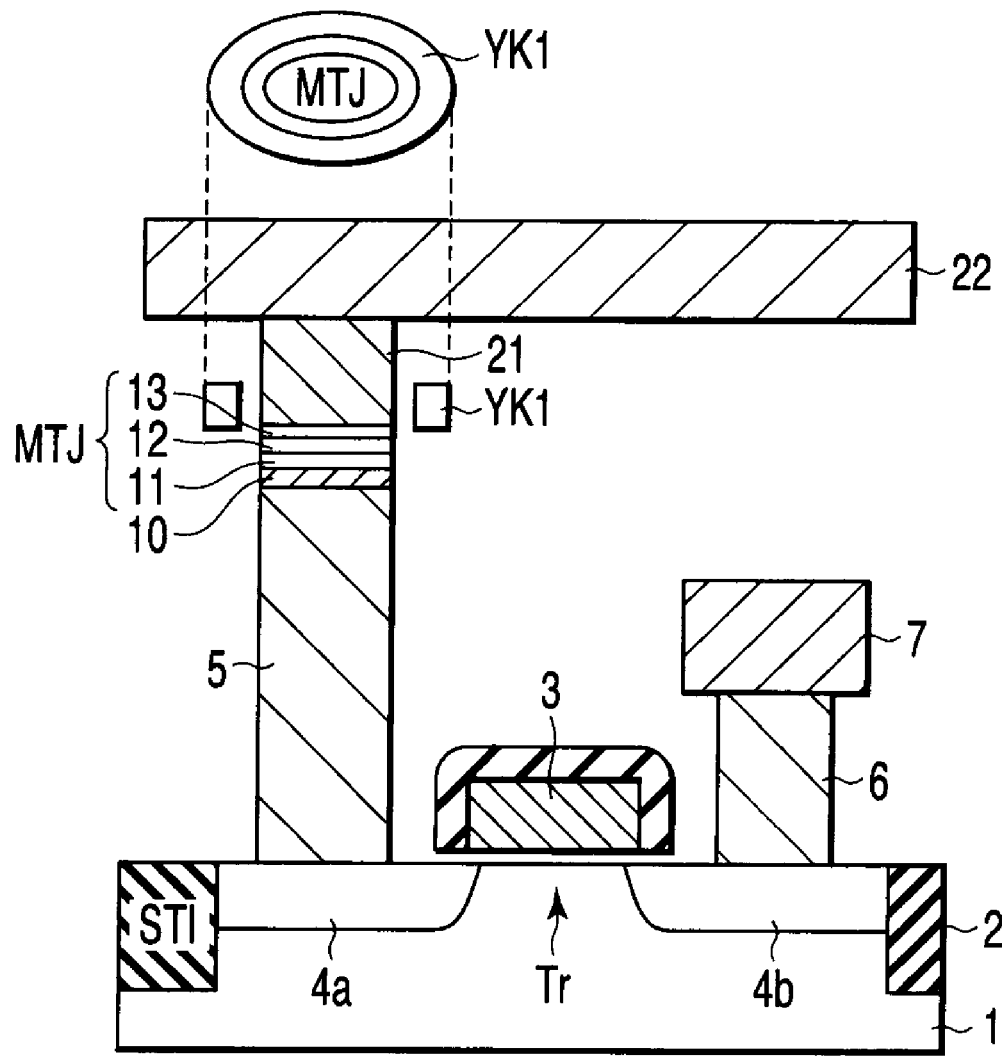
FIG. 8 is a sectional view showing a magnetic random access memory according to the third embodiment of the present invention.

FIG. 8 is a sectional view of a magnetic random access memory according to the third embodiment of the present invention. FIGS. 9A to 9F are schematic views each showing the position of the bottom surface of a yoke layer of the magnetic random access memory according to the third embodiment of the present invention. The structure of the magnetic random access memory according to the third embodiment will be explained below.

As shown in FIG. 8, the third embodiment uses only a yoke layer YK1 as the upper one of the yoke layers YK1 and YK2 in the second embodiment. For example, the yoke layer YK1 is formed around only a contact 21 on an MTJ element MTJ. Accordingly, the yoke layer YK1 does not surround the lower circumferential surface of the MTJ element MTJ.

Figure 9A:
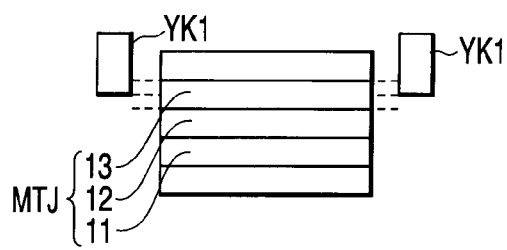
FIGS. 9A to 9F are schematic views each showing the position of the bottom surface of a yoke layer of the magnetic random access memory according to the third embodiment of the present invention.
Figure 9B:
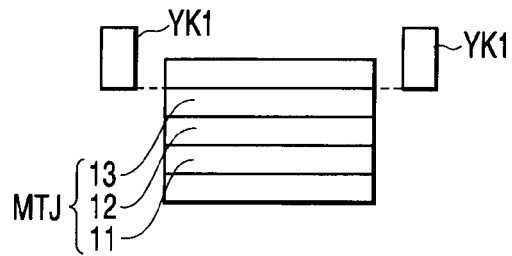
Figure 9C:
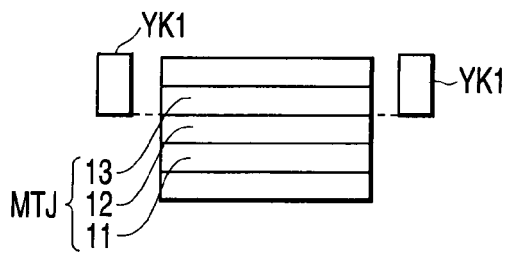

The bottom surface of the yoke layer YK1 is desirably positioned around a recording layer 13. More specifically, as shown in FIG. 9A, the bottom surface of the yoke layer YK1 is desirably positioned between the upper surface and bottom surface of the recording layer 13. Note that the bottom surface of the yoke layer YK1 may also be leveled with the upper surface of the recording layer 13 (FIG. 9B), or leveled with the bottom surface of the recording layer 13 (FIG. 9C). However, a difference of about ±50 nm is produced because the film thickness of the MTJ element MTJ is small compared to the processing dimension.

Figure 9D:
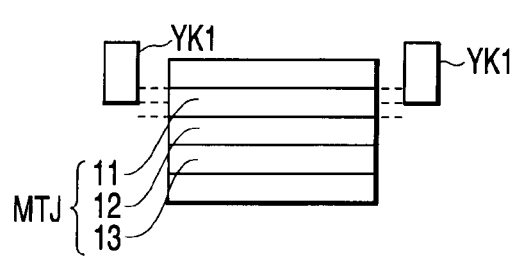

When a fixed layer 11 is formed on the side of an interconnection 22, the bottom surface of the yoke layer YK1 can be positioned around the fixed layer 11. More specifically, as shown in FIG. 9D, the bottom surface of the yoke layer YK1 can be positioned between the upper surface and bottom surface of the fixed layer 11. The bottom surface of the yoke layer YK1 may also be leveled with the upper surface of the fixed layer 11 (FIG. 9E), or may also be leveled with the bottom surface of the fixed layer 11 (FIG. 9F).

When any of these arrangements shown in FIGS. 9A to 9F is used, it is possible to cause the leakage magnetic field from the bottom surface of the yoke layer YK1 to act on the magnetization in the recording layer 13, and obtain the magnetic field assisting effect. When this effect is taken into consideration, FIG. 9A in which the magnetization in the recording layer 13 readily undergoes the influence of the leakage magnetic field is the most desirable example.

Figure 9E:
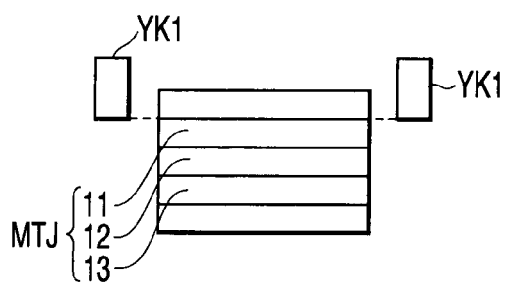
Figure 9F:
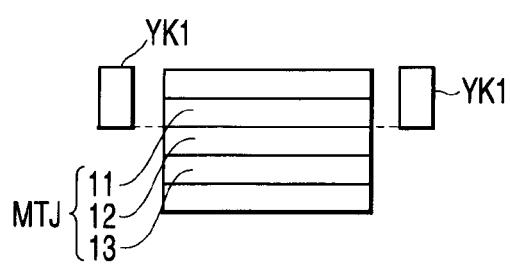

Note that in the examples shown in FIGS. 9D to 9F, the yoke layer YK1 may also be extended to make the bottom surface of the yoke layer YK1 approach the recording layer 13. In this case, the yoke layer YK1 surrounds the circumferential surfaces of the fixed layer 11 and a nonmagnetic layer 12, and the bottom surface of the yoke layer YK1 is positioned between the upper surface and bottom surface of the recording layer 13 or leveled with the upper surface or bottom surface of the recording layer 13.

[3-2] Principles

Figure 10A:
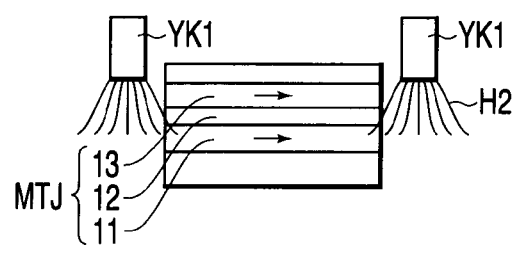
FIGS. 10A and 10B are views for explaining the principle of the magnetic field assist by a yoke layer in a parallel magnetization type MTJ element according to the third embodiment of the present invention.
Figure 10B:
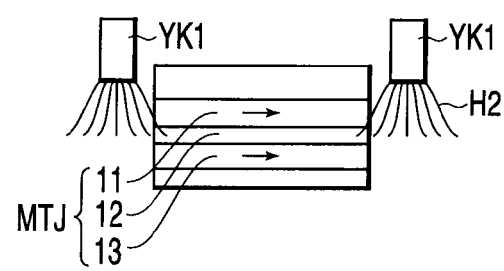
Figure 10C:
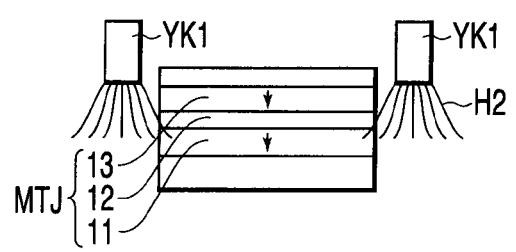
FIGS. 10C and 10D are views for explaining the principle of the magnetic field assist by a yoke layer in a perpendicular magnetization type MTJ element according to the third embodiment of the present invention.
Figure 10D:
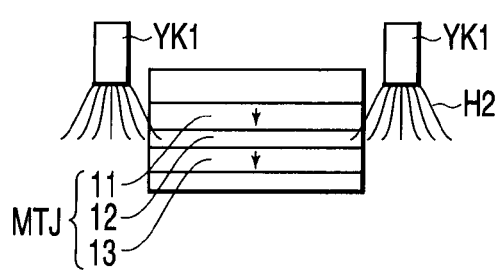

FIGS. 10A and 10B are views for explaining the principle of the magnetic field assist by the yoke layer in a parallel magnetization type MTJ element according to the third embodiment of the present invention. FIGS. 10C and 10D are views for explaining the principle of the magnetic field assist by the yoke layer in a perpendicular magnetization type MTJ element according to the third embodiment of the present invention. The principles of the magnetic field assist according to the third embodiment will be explained below.

FIGS. 10A and 10C illustrate the arrangement in which the recording layer 13 is positioned above the fixed layer 11 so that the bottom surface of the yoke layer YK1 is positioned around the recording layer 13. On the other hand, FIGS. 10B and 10D illustrate the arrangement in which the fixed layer 11 is positioned above the recording layer 13 so that the bottom surface of the yoke layer YK1 is positioned around the fixed layer 11.

In these structures, the contours of a high-density magnetic field H2 presumably diverge unlike in the second embodiment. However, even in these structures, if the MTJ element MTJ is positioned at the end portion of the yoke layer YK1, it is possible to place the MTJ element MTJ in a strong magnetic field distribution, and achieve the magnetic field assisting effect.

[3-3] Effects

The third embodiment described above can achieve the same effects as in the first embodiment. In addition, in the third embodiment, the MTJ element MTJ is formed around the bottom surface of the yoke layer YK1. Therefore, the high-density magnetic field H2 generated from the bottom surface of the yoke layer YK1 allows the MTJ element MTJ to readily undergo the magnetic field assisting effect of the yoke layer YK1. This makes it possible to further reduce the write current.

[4] Fourth Embodiment

The fourth embodiment is a modification of the second embodiment, which uses only the lower one of the two yoke layers in the second embodiment. Note that an explanation of the same features as in the first and second embodiments will not be repeated in the fourth embodiment.

[4-1] Structure

FIGS. 11 and 12 are sectional views of magnetic random access memories according to the fourth embodiment of the present invention. The structures of the magnetic random access memories according to the fourth embodiment will be explained below.

As shown in FIGS. 11 and 12, the fourth embodiment uses only a yoke layer YK2 as the lower one of the yoke layers YK1 and YK2 in the second embodiment. Accordingly, the yoke layer YK2 is positioned below an MTJ element MTJ, and formed around an interconnection 8 on a contact 5.

The structure shown in FIG. 11 is implemented by RIE processing and etching that leaves sidewalls behind. That is, the interconnection 8 and an interconnection 7 are respectively formed on the contact 5 and a contact 6 by RIE processing, and the yoke layer YK2 and a yoke layer YK3 are respectively formed on the interconnections 8 and 7. After that, the yoke layers YK2 and YK3 on the interconnections 8 and 7 are removed by etching. In the structure shown in FIG. 11, therefore, the yoke layers YK2 and YK3 are respectively formed on only the circumferential surfaces of the interconnections 8 and 7.

On the other hand, the structure shown in FIG. 12 is implemented by the damascene process by using the same method as for forming a barrier metal layer below an interconnection. That is, an insulating film is formed on the contact 5 and a contact 6, and trenches that expose the contacts 5 and 6 are formed in this insulating film. A yoke material is formed in the trenches, and an interconnection material is formed on this yoke material. After that, the yokes YK2 and YK3, the interconnection 8, and an interconnection 7 are formed by planarization using CMP. In the structure shown in FIG. 12, therefore, the yoke layers YK2 and YK3 are respectively formed on the circumferential surfaces and bottom surfaces of the interconnections 8 and 7.

Note that in each drawing, the MTJ element MTJ is formed such that the fixed layer 11 is positioned below the recording layer 13, so the upper surface of the yoke layer YK2 is positioned near the fixed layer 11. However, it is also possible to use a structure (top-pin structure) in which the MTJ element MTJ is formed such that the recording layer 13 is positioned below the fixed layer 11, thereby making the upper surface of the yoke layer YK2 approach the recording layer 13.

FIGS. 13A to 13F are schematic views each showing the position of the upper surface of the yoke layer of the magnetic random access memory according to the fourth embodiment of the present invention. In this embodiment, the yoke layer YK2 does not surround the upper circumferential surface of the MTJ element MTJ. Practical positions of the upper surface of the yoke layer YK2 will be explained below.

When the recording layer 13 is formed on the side of an interconnection 22, the upper surface of the yoke layer YK2 can be positioned around the fixed layer 11. More specifically, as shown in FIG. 13A, the upper surface of the yoke layer YK2 can be positioned between the upper surface and bottom surface of the fixed layer 11. The upper surface of the yoke layer YK2 may also be leveled with the bottom surface of the fixed layer 11 (FIG. 13B), or may also be leveled with the upper surface of the fixed layer 11 (FIG. 13C). However, a difference of about ±50 nm is produced because the film thickness of the MTJ element MTJ is small compared to the processing dimension.

When the fixed layer 11 is formed on the side of the interconnection 22, the upper surface of the yoke layer YK2 is desirably positioned around the recording layer 13. More specifically, as shown in FIG. 13D, the upper surface of the yoke layer YK2 is desirably positioned between the upper surface and bottom surface of the recording layer 13. Note that the upper surface of the yoke layer YK2 may also be leveled with the bottom surface of the recording layer 13 (FIG. 13E), or may also be leveled with the upper surface of the recording layer 13 (FIG. 13F).

When any of these arrangements shown in FIGS. 13A to 13F is used, it is possible to cause the leakage magnetic field from the bottom surface of the yoke layer YK2 to act on the magnetization in the recording layer 13, and obtain the magnetic field assisting effect. When this effect is taken into consideration, FIG. 13D in which the magnetization in the recording layer 13 readily undergoes the influence of the leakage magnetic field is the most desirable example.

Note that in the examples shown in FIGS. 13A to 13C, the yoke layer YK2 may also be extended to make the upper surface of the yoke layer YK2 approach the recording layer 13. In this case, the yoke layer YK2 surrounds the circumferential surfaces of the fixed layer 11 and a nonmagnetic layer 12, and the upper surface of the yoke layer YK2 is positioned between the upper surface and bottom surface of the recording layer 13 or leveled with the upper surface or bottom surface of the recording layer 13.

[4-2] Principles

Figure 14A:
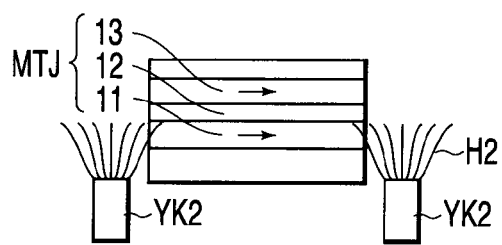
FIGS. 14A and 14B are views for explaining the principle of the magnetic field assist by a yoke layer in a parallel magnetization type MTJ element according to the fourth embodiment of the present invention.
Figure 14B:
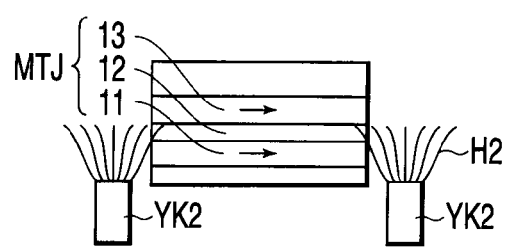
Figure 14C:
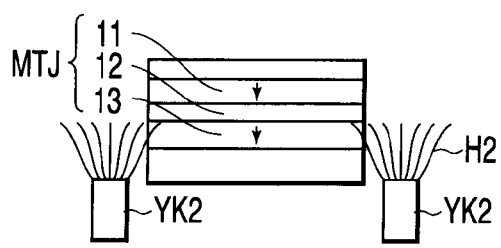
FIGS. 14C and 14D are views for explaining the principle of the magnetic field assist by a yoke layer in a perpendicular magnetization type MTJ element according to the fourth embodiment of the present invention.
Figure 14D:
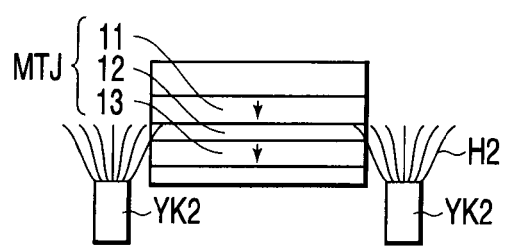

FIGS. 14A and 14B are views for explaining the principle of the magnetic field assist by the yoke layer in a parallel magnetization type MTJ element according to the fourth embodiment of the present invention. FIGS. 14C and 14D are views for explaining the principle of the magnetic field assist by the yoke layer in a perpendicular magnetization type MTJ element according to the fourth embodiment of the present invention. The principles of the magnetic field assist according to the fourth embodiment will be explained below.

FIGS. 14A and 14C illustrate the arrangement in which the recording layer 13 is positioned above the fixed layer 11 so that the upper surface of the yoke layer YK2 is positioned around the fixed layer 11. On the other hand, FIGS. 14B and 14D illustrate the arrangement in which the fixed layer 11 is positioned above the recording layer 13 so that the upper surface of the yoke layer YK2 is positioned around the recording layer 13.

In these structures, the contours of a high-density magnetic field H2 presumably diverge unlike in the second embodiment. However, even in these structures, if the MTJ element MTJ is positioned at the end portion of the yoke layer YK2, it is possible to place the MTJ element MTJ in a strong magnetic field distribution, and achieve the magnetic field assisting effect.

[4-3] Effects

The fourth embodiment described above can achieve the same effects as in the first embodiment. In addition, in the fourth embodiment, the MTJ element MTJ is formed around the upper surface of the yoke layer YK2. Therefore, the high-density magnetic field H2 generated from the upper surface of the yoke layer YK2 allows the MTJ element MTJ to readily undergo the magnetic field assisting effect of the yoke layer YK2. This makes it possible to further reduce the write current.

[5] Fifth Embodiment

The fifth embodiment is an example in which the contact on the MTJ element of the first embodiment or the like is downsized. Note that an explanation of the same features as in the first embodiment will not be repeated in the fifth embodiment.

[5-1] Structures

FIGS. 15 to 18 are sectional views of magnetic random access memories according to the fifth embodiment of the present invention. The structures of the magnetic random access memories according to the fifth embodiment will be explained below.

As shown in FIGS. 15 to 18, the fifth embodiment differs from the first embodiment in that a contact 21 on an MTJ element MTJ is narrowed. Therefore, the area of that portion of the contact 21 which is in contact with a recording layer 13 via a cap layer 20 is smaller than the area of the recording layer 13.

Figure 15:
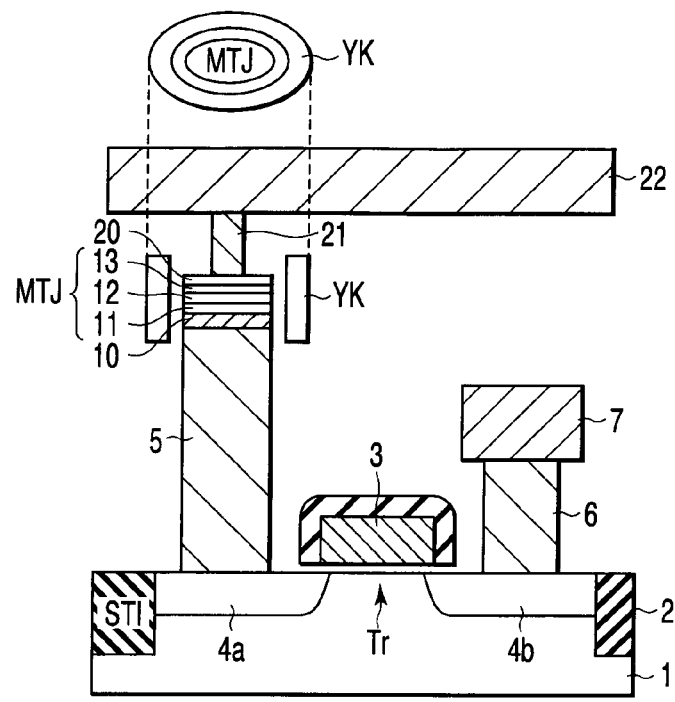
FIG. 15 is a sectional view showing a magnetic random access memory according to the fifth embodiment of the present invention.

The structure shown in FIG. 15 is a modification of the first embodiment, in which the contact 21 of the first embodiment is narrowed. In this structure, the contact 21 is positioned in the center of the MTJ element MTJ (recording layer 13). However, the contact 21 may also be shifted from the center.

Figure 16:
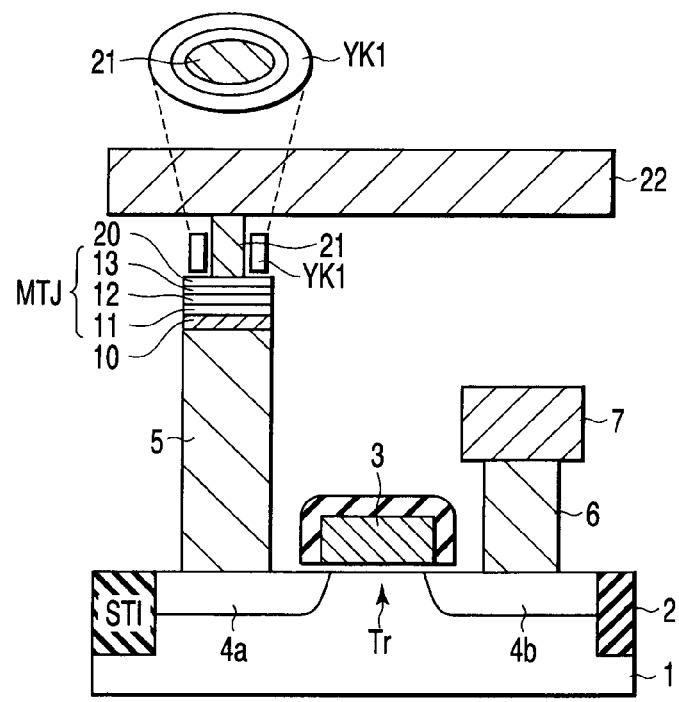
FIG. 16 is a sectional view showing a magnetic random access memory according to the fifth embodiment of the present invention.

The structure shown in FIG. 16 is a modification of the third embodiment, in which the contact 21 of the third embodiment is narrowed. In this structure, a yoke layer YK1 surrounds the contact 21, and the assisting effect is obtained by the leakage magnetic field from the lower surface of the yoke layer YK1.

Figure 17:
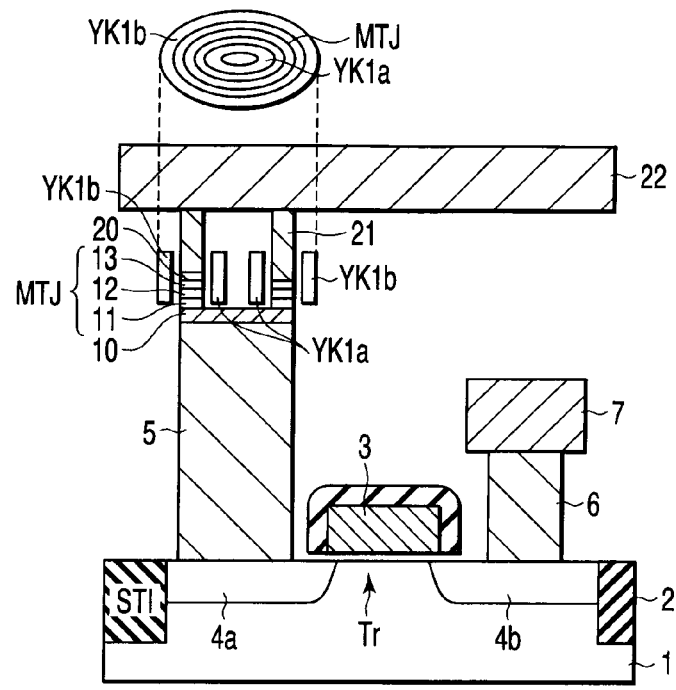
FIG. 17 is a sectional view showing a magnetic random access memory according to the fifth embodiment of the present invention.

In the structure shown in FIG. 17, the contact area is reduced by giving the MTJ element MTJ and contact 21a ring-like shape. In this structure, a yoke layer YK1a is formed inside the MTJ element MTJ, and a yoke layer YK1b is formed outside the MTJ element MTJ.

Figure 18:
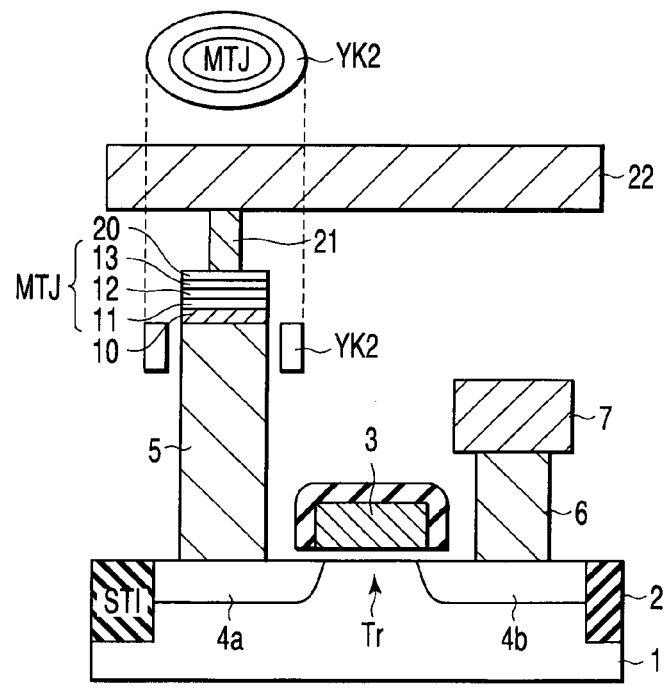
FIG. 18 is a sectional view showing a magnetic random access memory according to the fifth embodiment of the present invention.

The structure shown in FIG. 18 is an example in which the contact 21 as an upper contact is narrowed in the structure in which a yoke YK2 is formed only in the lower portion as in the fourth embodiment. In this structure, the yoke layer YK2 is formed around the circumferential surface of a lower contact 5. This achieves high processability in addition to the assisting effect obtained by the leakage magnetic field from the upper surface of the yoke layer YK2.

In these structures shown in FIGS. 15 to 18, the cap layer 20 is formed between the MTJ element MTJ and contact 21. However, the cap layer 20 need not always be formed between the MTJ element MTJ and contact 21. The resistance value of the cap layer 20 is, e.g., desirably about an order of magnitude higher than that of the recording layer 13. Examples of the material of the cap layer 20 are the material of a nonmagnetic layer 12, and a barrier metal material having a high sheet resistance. Examples of the material of the nonmagnetic layer 12 will be described later in section [8-2]. Examples of the barrier metal material are materials (a) to (k) below.

(a) Ti
(b) Ta
(c) Compounds containing Ti (e.g., TiN, TiW, TiSiN, $TiSi_x$, $TiB_2$, TiB, and TiC)
(d) Compounds containing Ta (e.g., $TaB_2$, TaB, TaC, TaN, $Ta_4N_5$, $Ta_5N_6$, $Ta_2N$)
(e) Compounds containing Zr (e.g., $ZrB_2$, ZrB, ZrC, and ZrN)
(f) Compounds containing Hf (e.g., HfB, HfC, and HfN)
(g) Compounds containing V (e.g., $VB_2$, VB, VC, and VN)
(h) Compounds containing Nb (e.g., $NbB_2$, NbB, NbC, and NbN)
(i) Compounds containing Cr (e.g., $CrB_2$, CrB, $Cr_2B$, $Cr_3C_2$, $Cr_2N$, and CrN)

(j) Compounds containing Mo (e.g., $Mo_2B_3$, $MoB_2$, MoB, $Mo_2B$, $Mo_xC_y$, $Mo_2C$, and MoN)

(k) Compounds containing W (e.g., $W_xB_y$, $W_2B_5$, $W_xC_y$, WC, $W_2C$, $W_xN_y$, and WN)

The cap layer 20 preferably has the same planar shape as that of the MTJ element MTJ in respect of the ease of the process, but may also have another planar shape. The area of the upper surface (the surface on the side of the contact 21) of the cap layer 20 is desirably larger than that of the bottom surface (the surface on the side of the cap layer 20) of the contact 21.

[5-2] Fabrication Method

FIGS. 19A to 19G are sectional views of fabrication steps of the magnetic random access memory according to the fifth embodiment of the present invention. A method of fabricating the magnetic random access memory according to the fifth embodiment will be explained below. The method will be explained by taking the structure shown in FIG. 17 as an example.

Figure 19A:
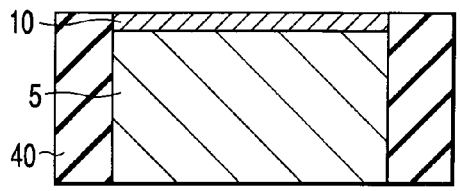
FIGS. 19A to 19G are sectional views showing fabrication steps of the magnetic random access memory according to the fifth embodiment of the present invention.

First, as shown in FIG. 19A, a contact 5 and lower electrode 10 are formed in an insulating film 40.

Figure 19B:
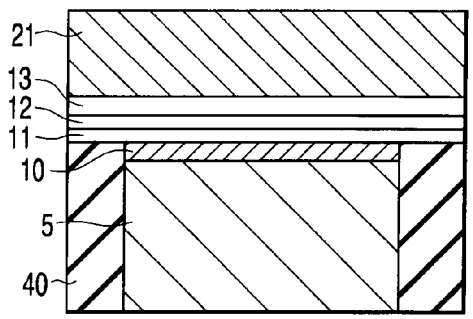

Then, as shown in FIG. 19B, a fixed layer 11, a nonmagnetic layer 12, a recording layer 13, and a contact 21 serving as a hard mask are sequentially deposited on the lower electrode 10 and insulating film 40.

Figure 19C:
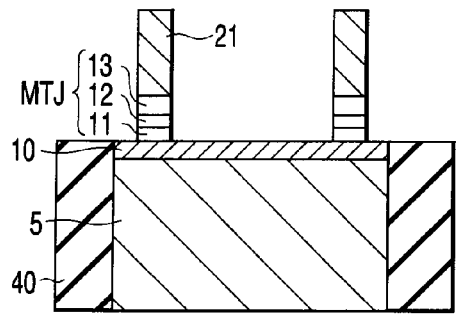

As shown in FIG. 19C, the contact 21 serving as a hard mask is processed into the shape of a ring, and the fixed layer 11, nonmagnetic layer 12, and recording layer 13 are also processed by using the contact 21. In this manner, a ring-like MTJ element MTJ is formed.

Figure 19D:
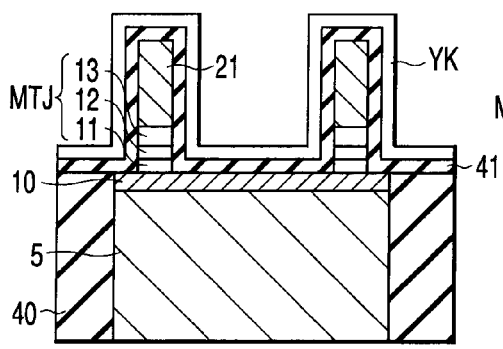

Subsequently, as shown in FIG. 19D, a sidewall insulating film 41 is deposited, and a yoke layer YK is deposited on the sidewall insulating film 41.

Figure 19E:
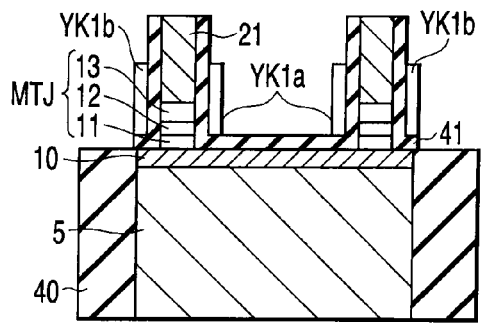

As shown in FIG. 19E, the yoke layer YK is etched away so as to remain on the circumferential surfaces of the MTJ element MTJ and contact 21. Then, the upper surface of the contact 21 is exposed by etching away the sidewall insulating film 41 from the upper surface.

Figure 19F:
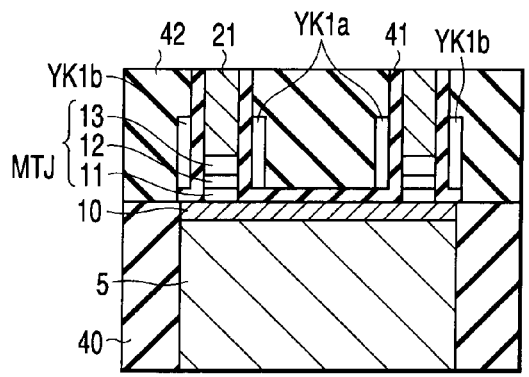

Next, as shown in FIG. 19F, an interlayer dielectric film 42 is deposited and planarized by CMP until the upper surface of the contact 21 is exposed.

Figure 19G:
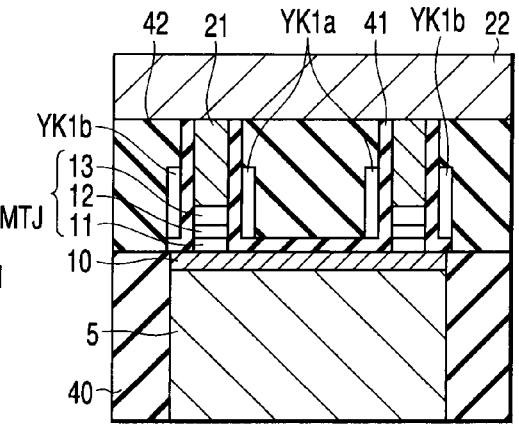

Finally, as shown in FIG. 19G, an interconnection 22 connecting to the contact 21 is formed. In this way, the structure shown in FIG. 17 is completed.

[5-3] Effects

The fifth embodiment described above can achieve the same effects as in the first embodiment. In addition, the fifth embodiment narrows the contact 21 on the MTJ element MTJ, thereby making the area of that portion of the contact 21 which is in contact with the recording layer 13 smaller than the area of the recording layer 13. During a write operation, therefore, magnetization reversal occurs from the local contact portion between the contact 21 and MTJ element MTJ, and propagates by the domain wall moving effect, thereby reversing the magnetization of the whole element. Accordingly, the write current of the write operation can be further reduced by the effect of the small contact, in addition to the magnetic field assisting effect of the yoke layer YK. Furthermore, the reduction of the effect obtained by current diffusion can be prevented by forming the cap layer 20 having a resistance higher than that of the recording layer 13.

[6] Sixth Embodiment

The sixth embodiment is an example in which a slit is formed in a yoke layer as in the second embodiment. However, while the slit is formed parallel to the film surface of an MTJ element in the second embodiment, a slit is formed perpendicularly to the film surface of an MTJ element in the sixth embodiment. Note that an explanation of the same features as in the first and second embodiments will not be repeated in the sixth embodiment.

[6-1] Structures

Figure 22:
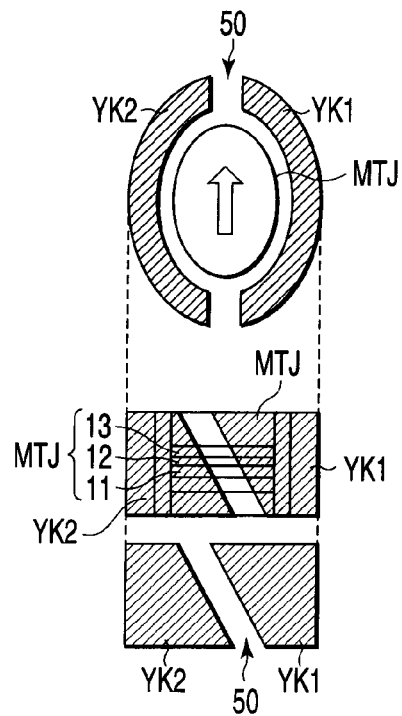
FIG. 22 is a schematic view showing vertical slits in a yoke layer according to the sixth embodiment of the present invention.

FIGS. 20 to 22 are schematic views of slits in the vertical direction of yoke layers according to the sixth embodiment of the present invention. These slits in the vertical direction of the yoke layers according to the sixth embodiment will be explained below.

As shown in each of FIGS. 20 to 22, the sixth embodiment differs from the second embodiment in that slits 50 in the direction (vertical direction) perpendicular to the film surface of an MTJ element MTJ are formed in a yoke layer YK. That is, the previous embodiments use the high magnetic field distribution near the yoke layer YK. However, this embodiment allows the MTJ element MTJ to exist in a high magnetic field by taking account of the vector of the magnetic field as well.

In the structure shown in FIG. 20, the slits 50 perpendicular to the film surface of the MTJ element MTJ are formed in a yoke layer at the two end portions in the easy magnetization axis direction of the MTJ element MTJ. The slits 50 separate the yoke layer into yoke layers YK1 and YK2.

In the structure shown in FIG. 21, the elliptic slits 50 extending perpendicularly to the film surface of the MTJ element MTJ are formed in a yoke layer at the two end portions in the easy magnetization axis direction of the MTJ element MTJ.

In the structure shown in FIG. 22, the slits 50 oblique to the film surface of the MTJ element MTJ are formed in a yoke layer at the two end portions in the easy magnetization axis direction of the MTJ element MTJ. The slits 50 separate the yoke layer into yoke layers YK1 and YK2.

Note that the positions of the slits 50 are not limited to the two end portions in the easy magnetization axis direction of the MTJ element MTJ. For example, the slit 50 may also be formed at the end portion in the hard magnetization axis direction of the MTJ element MTJ. In this case, the slit 50 is desirably formed at only one end portion in the hard magnetization axis direction of the MTJ element MTJ. Furthermore, when an MTJ element is a perpendicular magnetization type element, any number of slits 50 can be formed in any positions.

[6-2] Principle

Figure 23A:
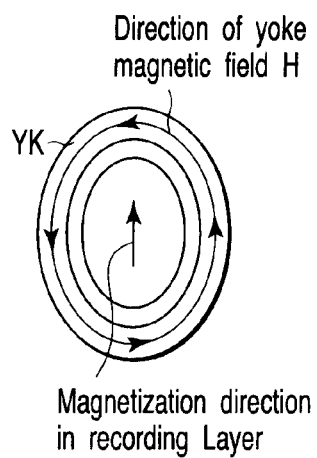
FIGS. 23A and 23B are views for explaining the principle of a magnetic field distribution from the slits in the yoke layer according to the sixth embodiment of the present invention.
Figure 23B:
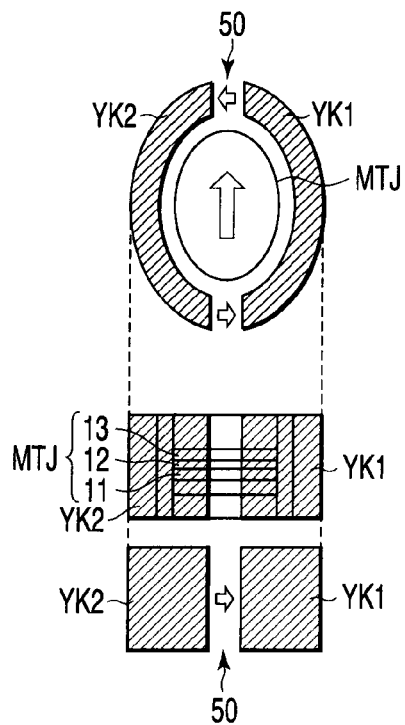

FIGS. 23A and 23B are views for explaining the principle of the magnetic field distribution from the slits in the yoke layer according to the sixth embodiment of the present invention. The principle of the magnetic field distribution from the slits in the yoke layer according to the sixth embodiment will be explained below.

As shown in FIG. 23A, when a write current is supplied to the MTJ element MTJ, a magnetic field H generated by this write current concentrates to the yoke layer YK. When the yoke layer YK is viewed from above, the magnetic field vector of the magnetic field H rotates around the MTJ element MTJ.

As shown in FIG. 23B, therefore, when the slits 50 are formed in a direction to intercept this magnetic field vector, magnetic field vectors are generated across the slits 50. As a consequence, a magnetic field H concentrated to the yoke layers YK1 and YK2 is distributed around the slits 50. Accordingly, the magnetic field assisting effect can be expected when the MTJ element MTJ is placed near this portion.

[6-3] Effects

The sixth embodiment described above can achieve the same effects as in the first embodiment. In addition, the slits 50 are formed in the yoke layer YK in the sixth embodiment. Therefore, the magnetic field vectors generated in the regions of the slits 50 allow the MTJ element MTJ readily undergo the magnetic field assisting effect of the yoke layer YK. This makes it possible to further reduce the write current.

[7] Seventh Embodiment

In the seventh embodiment, a cell layout of $6F^2$ ($2F \times 3F$) of each embodiment will be explained. Note that yoke layers are omitted from views for explaining this embodiment.

[7-1] First Layout Example

Figures 24A, 24B:
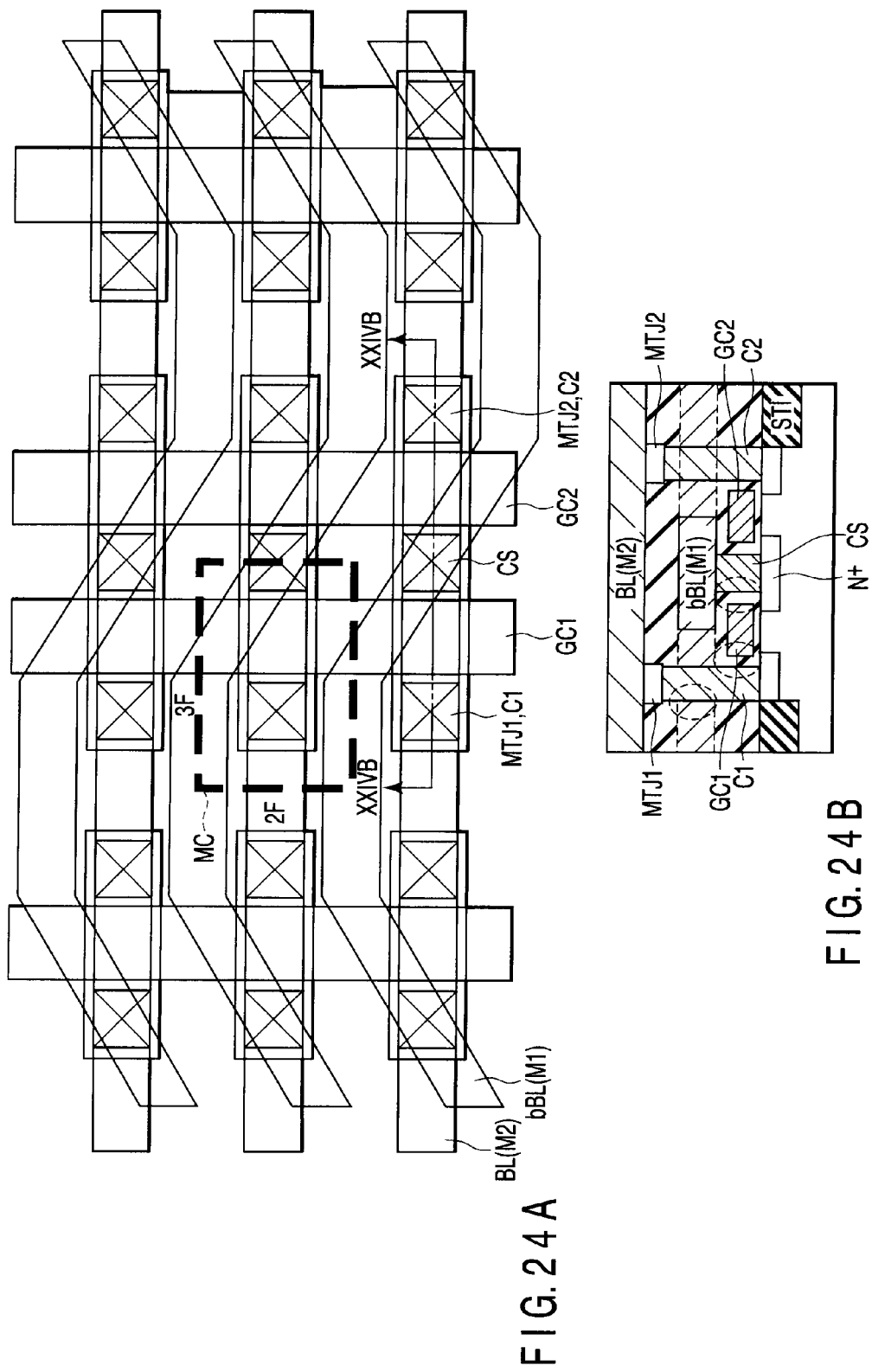
FIG. 24A is a schematic plan view of the first layout example of memory cells according to the seventh embodiment of the present invention.
FIG. 24B is a sectional view taken along a line XXIV-XXIV in FIG. 24A.

FIG. 24A is a schematic plan view of the first layout example of memory cells according to the seventh embodiment of the present invention. FIG. 24B is a sectional view taken along a line XXIVB-XXIVB in FIG. 24A. The first layout example according to the seventh embodiment will be explained below.

As shown in FIGS. 24A and 24B, a source line bBL is partially obliquely formed in the first layout example. Accordingly, the source line bBL has a first portion that extends obliquely, and a second portion that extends parallel to a bit line BL. The first portion of the source line bBL is positioned between adjacent MTJ elements MTJ1 and MTJ2, and connected to a source contact CS. The second portions of the source line bBL extend parallel to the bit line BL from the two ends of the first portion. As shown in FIG. 24B, therefore, in the vicinity of the MTJ element MTJ1, the second portion of the source line bBL extends behind a contact C1 connecting to the MTJ element MTJ1. In the vicinity of the MTJ element MTJ2, the second portion of the source line bBL extends before a contact C2 connecting to the MTJ element MTJ2.

In the first layout example as described above, the source line bBL is partially obliquely formed to extend in the same direction as that of the bit line BL. This makes it possible to reduce the area of a memory cell MC to $6F^2$.

[7-2] Second Layout Example

Figures 25A, 25B:
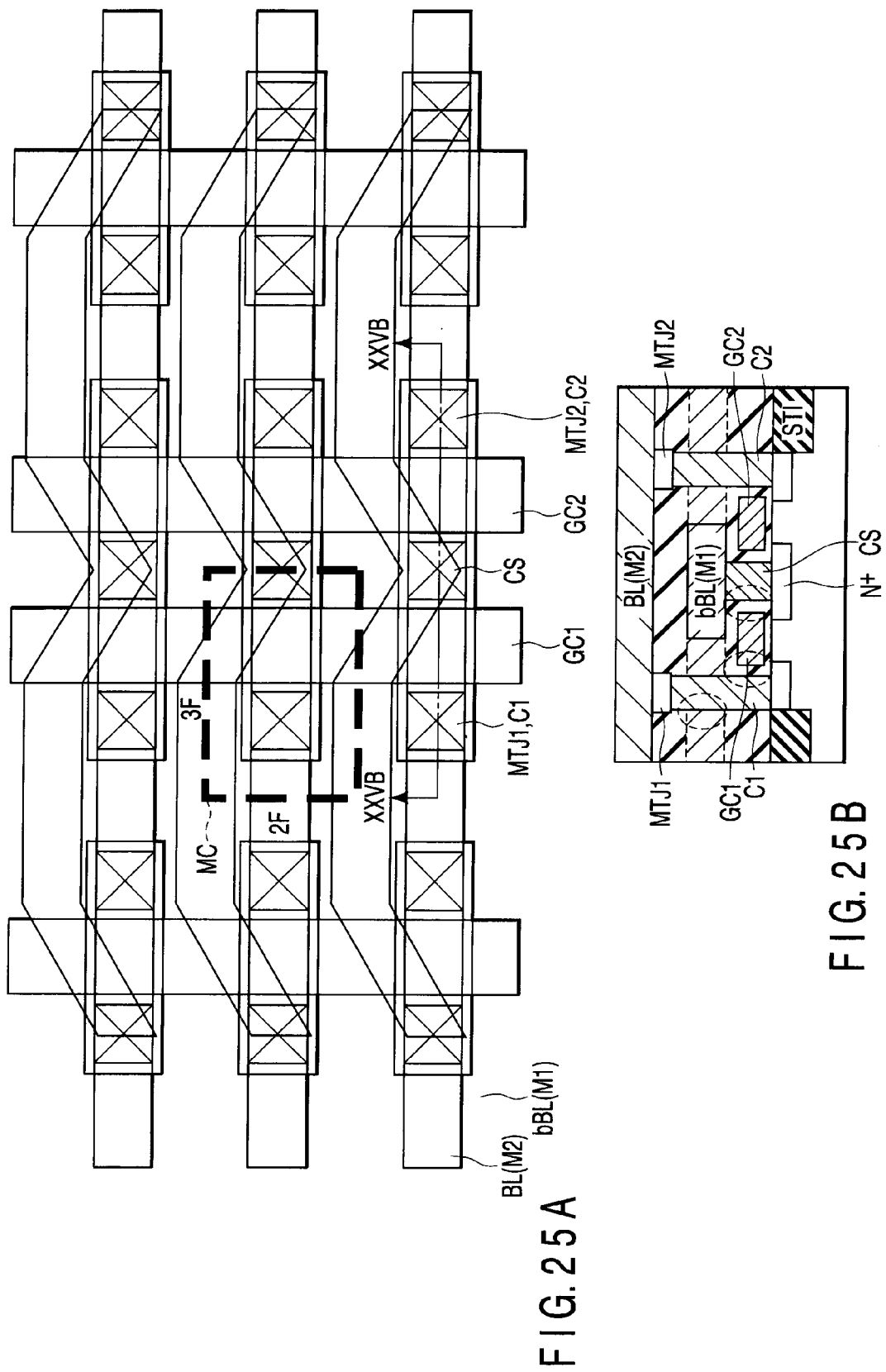
FIG. 25A is a schematic plan view of the second layout example of memory cells according to the seventh embodiment of the present invention.
FIG. 25B is a sectional view taken along a line XXV-XXV in FIG. 25A.

FIG. 25A is a schematic plan view of the second layout example of memory cells according to the seventh embodiment of the present invention. FIG. 25B is a sectional view taken along a line XXVB-XXVB in FIG. 25A. The second layout example according to the seventh embodiment will be explained below.

As shown in FIGS. 25A and 25B, in the second layout example, a source line bBL is partially obliquely formed as in the first layout example. However, the second layout example differs from the first layout example in the following point.

The source line bBL of the second layout example has a first portion that extends in a first oblique direction, a second portion that extends in a second oblique direction, and a third portion that extends parallel to a bit line BL. The first portion of the source line bBL is formed in the first oblique direction (toward the upper left corner of the layout when viewed from above) from a source contact CS to an MTJ element MTJ1. The second portion of the source line bBL is formed in the second oblique direction (toward the upper right corner of the layout when viewed from above) from the source contact CS to an MTJ element MTJ2. The intersection of the first and second portions is connected to the source contact CS, so the first and second portions form a V-shape. The third portion of the source line bBL extends parallel to the bit line BL from the end portion of the first or second portion.

The second layout example as described above can achieve the same effect as in the first layout example. In addition, each cell can operate in the same direction as that of the bit line BL.

[7-3] Third Layout Example

Figure 26:
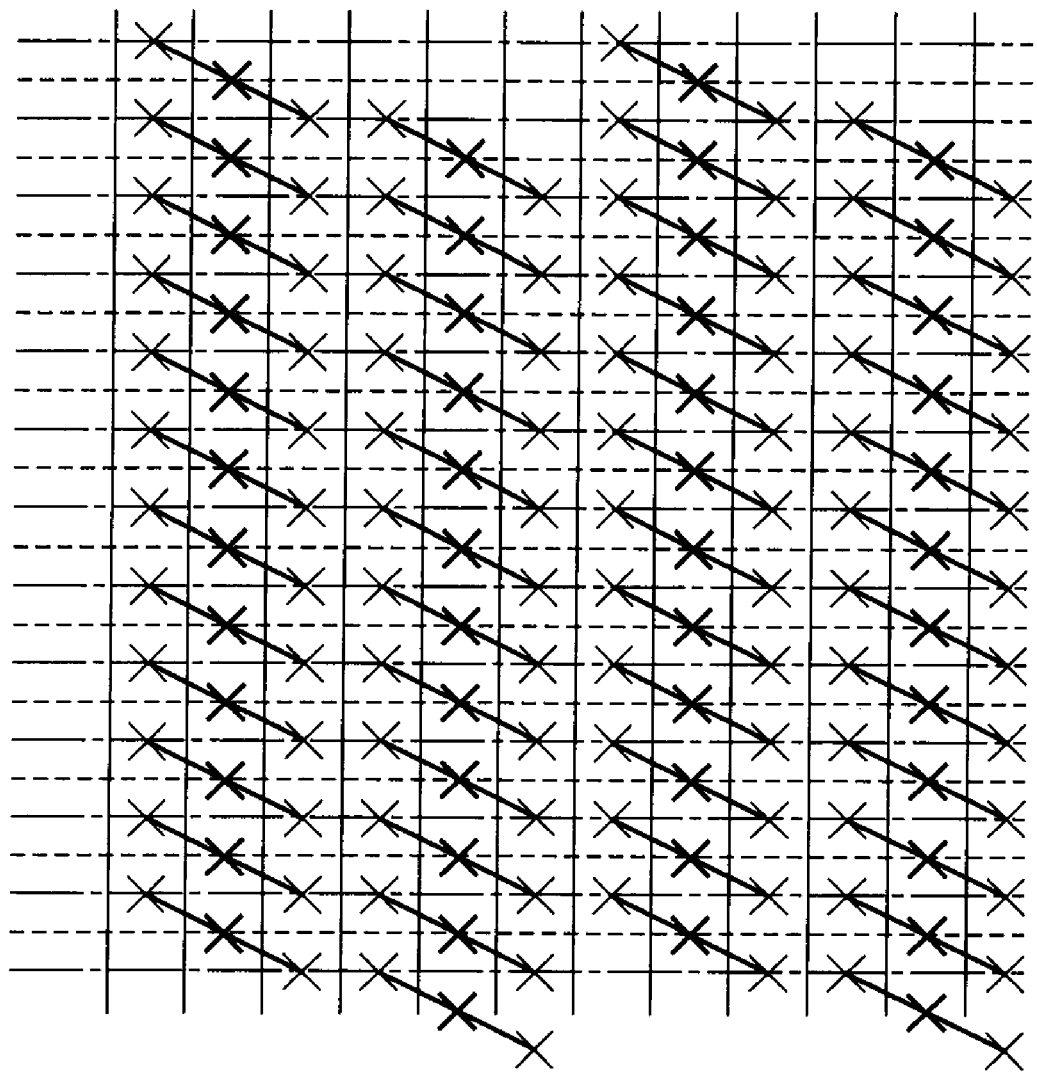
FIG. 26 is a schematic plan view of the third layout example of memory cells according to the seventh embodiment of the present invention.
Figure 27A:
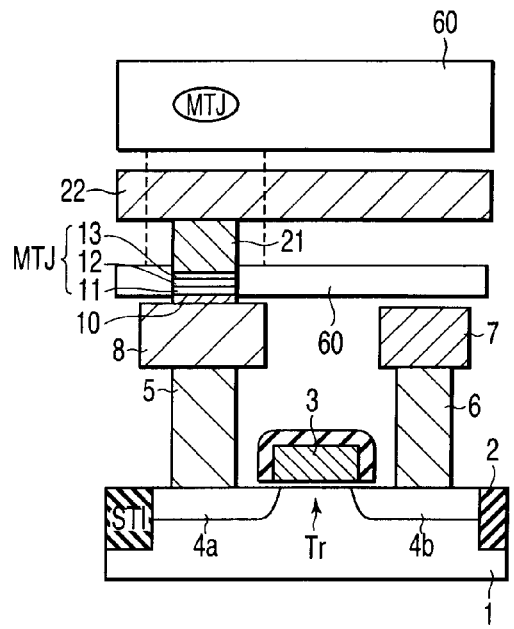
Figure 27B:
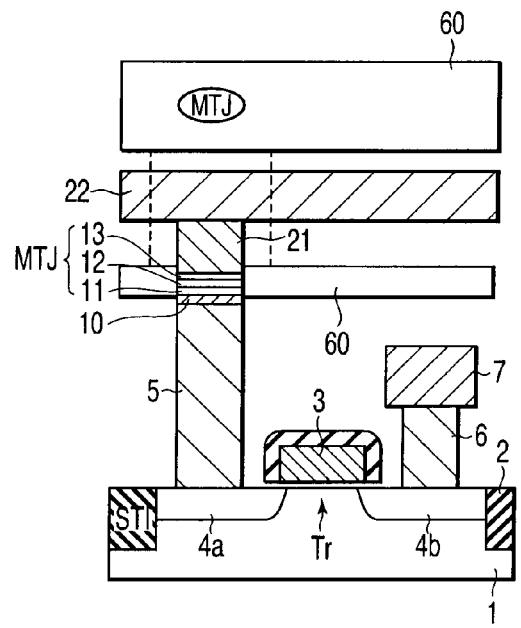
Figure 27C:
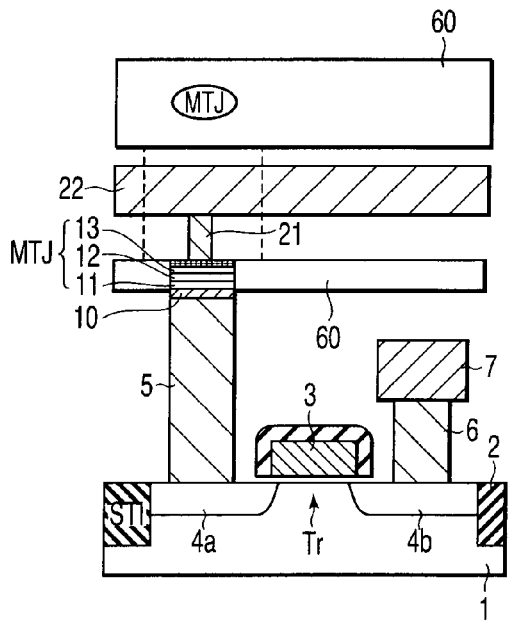
Figure 27D:
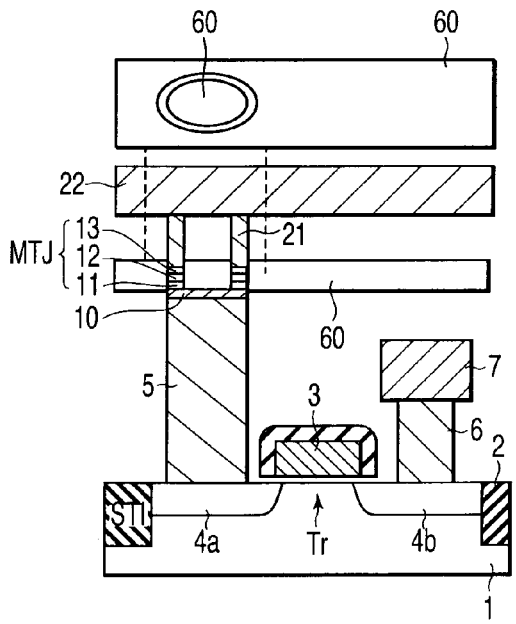

FIG. 26 is a schematic plan view of the third layout example of memory cells according to the seventh embodiment of the present invention. The third layout example according to the seventh embodiment will be explained below.

In the third layout example as shown in FIG. 26, source lines and bit lines run in the same direction, and gate electrodes (active regions) are formed obliquely.

In the third layout example as described above, the area of a memory cell MC can be reduced to $6F^2$ by obliquely forming the gate electrodes (active regions) and arranging the source lines and bit lines in the same direction.

[8] Eighth Embodiment

In the eighth embodiment, the MTJ element used in each embodiment will be explained.

[8-1] Magnetization Arrangement

The magnetization directions in a fixed layer 11 and recording layer 13 of an MTJ element MTJ can be perpendicular to the film surface (a perpendicular magnetization type element), or parallel to the film surface (a parallel magnetization type element).

Note that a perpendicular magnetization type MTJ element MTJ has the advantage that the longitudinal direction of the element shape does not determine the magnetization direction unlike in the conventional element.

[8-2] Materials

Examples of the materials of the MTJ element MTJ are as follows.

As the material of the fixed layer 11 and recording layer 13, it is favorable to use any of Fe, Co, Ni, alloys of these metals, magnetite having a high spin polarization ratio, oxides such as $CrO_2$ and $RXMnO_{3-y}$ (R; a rare earth element, and X; Ca, Ba, or Sr), and Heusler alloys such as NiMnSb and PtMnSb. These magnetic materials may also contain more or less nonmagnetic elements such as Ag, Cu, Au, Al, Mg, Si, Bi, Ta, B, C, O, N, Pd, Pt, Zr, Ir, W, Mo, and Nb, provided that the materials do not lose their ferromagnetism.

As the material of a nonmagnetic layer 12, it is possible to use various dielectric materials such as $Al_2O_3$, $SiO_2$, MgO, AlN, $Bi_2O_3$, $MgF_2$, $CaF_2$, $SrTiO_2$, and $AlLaO_3$. Oxygen, nitrogen, and fluorine deficiencies may exist in these dielectric materials.

An antiferromagnetic layer for fixing the magnetization direction in the fixed layer 11 may also be formed on the surface of the fixed layer 11 away from the nonmagnetic layer 12. As the material of this antiferromagnetic layer, it is possible to use, e.g., Fe—Mn, Pt—Mn, Pt—Cr—Mn, Ni—Mn, Ir—Mn, NiO, or $Fe_2O_3$.

Note that examples of the perpendicular magnetic materials for implementing the perpendicular magnetization type MTJ element MTJ are as follows.

First, a magnetic material having a high coercive force to be used as the perpendicular magnetic material of the fixed layer 11 and recording layer 13 is a material having a high magnetic anisotropic energy density of $1 \times 10^6$ erg/cc or more. Examples of the material will be explained below.

Example 1

"A material made of an alloy containing at least one of Fe (iron), Co (cobalt), and Ni (nickel), and at least one of Cr (chromium), Pt (platinum), and Pd (palladium)"

Examples of an ordered alloy are Fe(50)Pt(50), Fe(50)Pd(50), and Co(50)Pt(50). Examples of a random alloy are a CoCr alloy, CoPt alloy, CoCrPt alloy, CoCrPtTa alloy, and CoCrNb alloy.

Example 2

"A material having a structure obtained by alternately stacking at least one of Fe, Co, and Ni or an alloy containing one of Fe, Co, and Ni, and one of Pd and Pt or an alloy containing one of Pd and Pt"

Examples are a Co/Pt artificial lattice, Co/Pd artificial lattice, and CoCr/Pt artificial lattice. When the Co/Pt artificial lattice or Co/Pd artificial lattice is used, it is possible to obtain a high resistance change ratio (MR ratio) of about 40%.

Example 3

"An amorphous alloy containing at least one rare earth metal such as Tb (terbium), Dy (dysprosium), and Gd (gadolinium), and at least one transition metal"

Examples are TbFe, TbCo, TbFeCo, DyTbFeCo, and GdTbCo.

The recording layer 13 can be made of a magnetic material having a high coercive force as described above, and can also be made of a magnetic material given a magnetic anisotropic energy density lower than that of the high-coercive-force magnetic material as described above by adjusting the composition ratio, adding an impurity, or adjusting the thickness. Examples of the material will be explained below.

Example 1

"A material obtained by adding an impurity to an alloy containing at least one of Fe, Co, and Ni and at least one of Cr, Pt, and Pd"

An example of an ordered alloy is a material given a low magnetic anisotropic energy density by adding an impurity such as Cu, Cr, or Ag to Fe(50)Pt(50), Fe(50)Pd(50), or Co(50)Pt(50). An example of a random alloy is a material given a low magnetic anisotropic energy density by increasing the ratio of nonmagnetic elements in a CoCr alloy, CoPt alloy, CoCrPt alloy, CoCrPtTa alloy, or CoCrNb alloy.

Example 2

"A material which has a structure obtained by alternately stacking at least one of Fe, Co, and Ni or an alloy containing one of Fe, Co, and Ni, and one of Pd and Pt or an alloy containing one of Pd and Pt, and in which the thickness of a layer made of the former element or alloy or the thickness of a layer made of the latter element or alloy is adjusted"

The thickness of at least one of Fe, Co, and Ni or the alloy containing one of Fe, Co, and Ni has an optimum value, and the thickness of one of Pd and Pt or the alloy containing one of Pd and Pt has an optimum value. As the thicknesses depart from these optimum values, the magnetic anisotropic energy density gradually lowers.

Example 3

"A material obtained by adjusting the composition ratio of an amorphous alloy containing at least one rare earth metal such as Tb (terbium), Dy (dysprosium), and Gd (gadolinium), and at least one transition metal"

An example is a material given a low magnetic anisotropic energy density by adjusting the composition ratio of an amorphous alloy such as TbFe, TbCo, TbFeCo, DyTbFeCo, or GdTbCo.

[8-3] Planar Shape

Although the planar shape of the MTJ element MTJ is an ellipse in each of the above embodiments, the present invention is not limited to this shape. The planar shape of the MTJ element MTJ can be changed to, e.g., a rectangle, square, circle, hexagon, rhomb, parallelogram, cross, or bean (recessed shape).

When using shape magnetic anisotropy in a parallel magnetization type MTJ element MTJ, the dimension in the longitudinal direction (easy magnetization axis direction) of the MTJ element MTJ is desirably about 2F where F (a minimum feature size) is the dimension in the short-side direction (hard magnetization axis direction).

A perpendicular magnetization type MTJ element MTJ can have any of the above shapes because the magnetization direction is independent of a shape.

[8-4] Tunnel Junction Structures

The MTJ element MTJ can have a single-tunnel-junction (single-junction) structure or double-tunnel-junction (double-junction) structure.

As shown in FIG. 1 and the like, a single-tunnel-junction MTJ element MTJ has a fixed layer 11, a recording layer 13, and a nonmagnetic layer 12 formed between the fixed layer 11 and recording layer 13. That is, the MTJ element MTJ has one nonmagnetic layer.

A double-tunnel-junction MTJ element MTJ has a first fixed layer, a second fixed layer, a recording layer formed between the first and second fixed layers, a first nonmagnetic layer formed between the first fixed layer and recording layer, and a second nonmagnetic layer formed between the second fixed layer and recording layer. That is, the MTJ element MTJ has two nonmagnetic layers.

The MR (Magneto Resistive) ratio (the change ratio of the resistance of a state "1" to that of a state "0") of the double-tunnel-junction structure deteriorates less than that of the single-tunnel-junction structure when the same external bias is applied, so the double-tunnel-junction structure can operate with a bias higher than that of the single-tunnel-junction structure. That is, the double-tunnel-junction structure is advantageous when reading out information from a cell.

[9] Ninth Embodiment

The ninth embodiment gives permeability to an insulating film around an MTJ element, instead of the yoke layer YK explained in each embodiment, thereby obtaining the same effects as those of the yoke layer YK.

More specifically, as shown in FIGS. 27A to 27D, an insulating film having permeability is used as an interlayer dielectric film 60 buried around an MTJ element MTJ. Alternatively, as shown in FIGS. 28A to 28D, an insulating film having permeability is used as a sidewall insulating film 61 around an MTJ element MTJ.

Examples of the interlayer dielectric film 60 and sidewall insulating film 61 are SOG (Spin On Glass) obtained by incorporating a magnetic material into an insulator, an $SiO_2$ film formed by, e.g., CVD or sputtering, and a low-k organic insulating film.

Note that the same effects as those of the yoke layer YK are obtained when the permeability is 100 or more, and the permeability is more desirably 1,000 or more.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
a magnetoresistive effect element which includes a fixed layer in which a magnetization direction is fixed, a recording layer in which a magnetization direction is reversible, and a nonmagnetic layer formed between the fixed layer and the recording layer, and in which the magnetization directions in the fixed layer and the recording layer take one of a parallel state and an anti-parallel state in accordance with a direction of an electric current supplied between the fixed layer and the recording layer; and
a yoke layer which concentrates a magnetic field generated by the electric current, and causes the magnetic field to act on magnetization in the recording layer, the yoke layer not being formed above an upper surface or below a bottom surface of the magnetoresistive effect element.

2. The memory according to claim 1, wherein the yoke layer surrounds a circumferential surface of the magnetoresistive effect element.

3. The memory according to claim 1, wherein the yoke layer has a slit around the recording layer.

4. The memory according to claim 1, wherein an end portion of the yoke layer is positioned between an upper surface and bottom surface of the recording layer.

5. The memory according to claim 1, wherein a bottom surface of the yoke layer is positioned between an upper surface and bottom surface of the recording layer.

6. The memory according to claim 1, wherein an upper surface of the yoke layer is positioned between an upper surface and bottom surface of the recording layer.

7. The memory according to claim 6, which further comprises an interconnection formed below the magnetoresistive effect element, and
in which the yoke layer is formed around the interconnection.

8. The memory according to claim 1, which further comprises a contact connected to the recording layer and in contact with the recording layer by an area smaller than an area of the recording layer, and
in which the yoke layer surrounds the magnetoresistive effect element.

9. The memory according to claim 1, which further comprises a contact connected to the recording layer and in contact with the recording layer by an area smaller than an area of the recording layer, and
in which the yoke layer surrounds the contact.

10. The memory according to claim 1, wherein
the magnetoresistive effect element and the yoke layer have a ring-like shape, and
the yoke layer comprises a first portion formed inside the magnetoresistive effect element, and a second portion formed outside the magnetoresistive effect element.

11. The memory according to claim 1, which further comprises a contact connected to the recording layer and in contact with the recording layer by an area smaller than an area of the recording layer, and
in which an upper surface of the yoke layer is positioned around the fixed layer.

12. The memory according to claim 1, wherein the yoke layer surrounds a circumferential surface of the magnetoresistive effect element, and has slits at two ends in an easy magnetization axis direction of the magnetoresistive effect element.

13. The memory according to claim 12, wherein the slits are formed perpendicularly to a film surface of the magnetoresistive effect element.

14. The memory according to claim 12, wherein the slits have an elliptic shape extending perpendicularly to a film surface of the magnetoresistive effect element.

15. The memory according to claim 12, wherein the slits are formed obliquely to a film surface of the magnetoresistive effect element.

* * * * *